(12) United States Patent
Lee et al.

(10) Patent No.: US 9,698,300 B2
(45) Date of Patent: Jul. 4, 2017

(54) METHOD FOR MANUFACTURING SOLAR CELL

(71) Applicant: LG ELECTRONICS INC., Seoul (KR)

(72) Inventors: Kyoungsoo Lee, Seoul (KR); Minho Choi, Seoul (KR); Jinhyung Lee, Seoul (KR); Gyeayoung Kwag, Seoul (KR); Sangwook Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/733,620

(22) Filed: Jun. 8, 2015

(65) Prior Publication Data

US 2015/0357510 A1    Dec. 10, 2015

(30) Foreign Application Priority Data

Jun. 9, 2014 (KR) ........................ 10-2014-0069659

(51) Int. Cl.
*H01L 21/00* (2006.01)
*H01L 31/18* (2006.01)
*H01L 21/30* (2006.01)

(52) U.S. Cl.
CPC ...... *H01L 31/1864* (2013.01); *H01L 21/3003* (2013.01); *H01L 31/1868* (2013.01); *Y02E 10/50* (2013.01); *Y02P 70/521* (2015.11)

(58) Field of Classification Search
CPC .................................................. H01L 31/0236
See application file for complete search history.

(56) References Cited

U.S. PATENT DOCUMENTS

| | | | | |
|---|---|---|---|---|
| 5,529,951 A | * | 6/1996 | Noguchi | B23K 26/032 117/43 |
| 5,798,744 A | * | 8/1998 | Tanaka | G09G 3/3648 345/206 |
| 9,231,169 B2 | * | 1/2016 | Im | H01L 33/40 |

(Continued)

FOREIGN PATENT DOCUMENTS

CN        102640300 A     8/2012
FR         2977079 A1     12/2012
(Continued)

*Primary Examiner* — Zandra Smith
*Assistant Examiner* — Andre' C Stevenson
(74) *Attorney, Agent, or Firm* — Birch, Stewart, Kolasch & Birch, LLP

(57) ABSTRACT

A method of manufacturing a solar cell is discussed. The method of manufacturing the solar cell includes: forming a conductive region on a semiconductor substrate; forming an electrode connected to the conductive region; and post-processing the semiconductor substrate to passivate the semiconductor substrate. The post-processing of the semiconductor substrate comprises a main processing process for heat-treating the semiconductor substrate while providing light to the semiconductor substrate. A temperature of the main processing process is about 100° C. to about 800° C., and the temperature and light intensity of the main processing process satisfy Equation of $1750-31.8 \cdot T+(0.16) \cdot T^2 \leq I$. Here, T is the temperate (° C.) of the main processing process, and I is the light intensity (mW/cm$^2$) of the main processing process.

20 Claims, 12 Drawing Sheets

ST54

(56) References Cited

U.S. PATENT DOCUMENTS

| | | | |
|---|---|---|---|
| 2001/0000243 A1* | 4/2001 | Sugano | H01L 21/2026 438/166 |
| 2003/0013280 A1* | 1/2003 | Yamanaka | C23C 16/24 438/487 |
| 2011/0064632 A1* | 3/2011 | Huang | B01D 53/9477 423/212 |
| 2011/0126898 A1 | 6/2011 | Harley et al. | |
| 2012/0171804 A1* | 7/2012 | Moslehi | B23K 26/073 438/71 |
| 2015/0013758 A1 | 1/2015 | Harrison et al. | |
| 2015/0075605 A1* | 3/2015 | Miyamoto | H01L 31/02168 136/256 |
| 2015/0111333 A1* | 4/2015 | Wenham | H01L 31/1864 438/58 |
| 2015/0116721 A1* | 4/2015 | Kats | G01J 3/26 356/454 |

FOREIGN PATENT DOCUMENTS

| | | |
|---|---|---|
| JP | 2008-78662 A | 4/2008 |
| JP | 2010-183011 A | 8/2010 |
| JP | 2013-74217 A | 4/2013 |
| KR | 10-2009-0110029 A | 10/2009 |
| WO | WO 2013/173867 A1 | 11/2013 |

* cited by examiner

METHOD FOR MANUFACTURING SOLAR CELL

CROSS-REFERENCE TO RELATED APPLICATION

This application claims the priority benefit of Korean Patent Application No. 10-2014-0069659, filed on Jun. 9, 2014 in the Korean Intellectual Property Office, the disclosure of which is incorporated herein by reference.

BACKGROUND OF THE INVENTION

1. Field of the Invention

Embodiments of the present invention relate to a method for manufacturing a solar cell, and more particularly to a method for manufacturing a solar cell based on a crystalline semiconductor substrate.

2. Description of the Related Art

In recent years, exhaustion of existing energy resources, such as petroleum and coal, has been forecast with the result that interest in alternative energy resources substituting for the existing energy resources has risen. Among such alternative energy resources is a solar cell that converts photovoltaic energy into electrical energy using a semiconductor device, which is in the spotlight as a next-generation cell.

The solar cell may be fabricated through formation of various layers and electrodes based on design. The design of various layers and electrodes may determine the efficiency of the solar cell. Low efficiency of the solar cell must be overcome in order to commercialize the solar cell. For this reason, various layers and electrodes of the solar cell are designed such that the efficiency of the solar cell can be maximized. In addition, it is necessary to provide a method for manufacturing a solar cell that is capable of simplifying various processes for manufacturing a solar cell having various layers and electrodes.

SUMMARY OF THE INVENTION

Therefore, the embodiments of the present invention have been made in view of the above problems, and it is an object of the embodiments of the present invention to provide a method for manufacturing a solar cell that is capable of reducing an output loss of the solar cell.

According to an embodiment of the present invention, a method of manufacturing a solar cell includes: forming a conductive region on a semiconductor substrate; forming an electrode connected to the conductive region; and post-processing the semiconductor substrate to passivate the semiconductor substrate. The post-processing of the semiconductor substrate comprises a main processing process for heat-treating the semiconductor substrate while providing light to the semiconductor substrate. A temperature of the main processing process is about 100° C. to about 800° C., and the temperature and light intensity of the main processing process satisfy Equation of $1750-31.8 \cdot T+(0.16) \cdot T^2 \leq I$. Here, T is the temperate (° C.) of the main processing process, and I is the light intensity (mW/cm$^2$) of the main processing process.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE EMBODIMENTS

Figure 1:
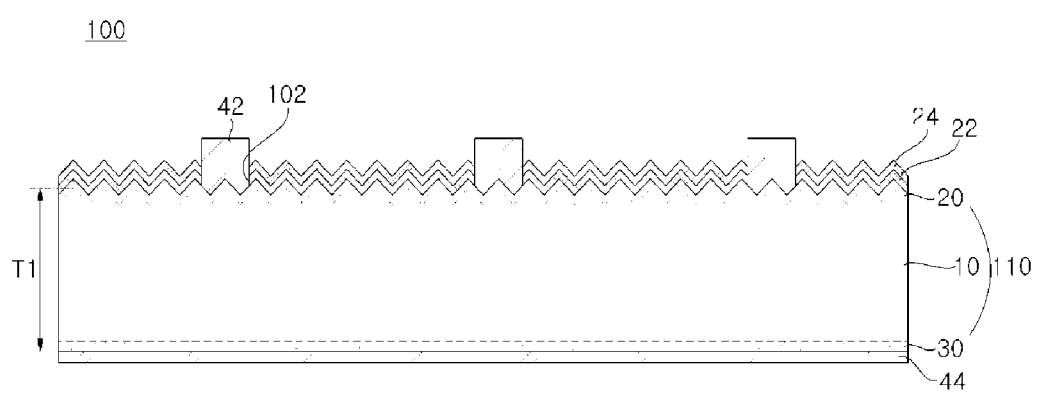
FIG. 1 is a sectional view showing an example of a solar cell manufactured using a manufacturing method of a solar cell according to an embodiment of the present invention.

Reference will now be made in detail to the embodiments of the present invention, examples of which are illustrated in the accompanying drawings. However, it will be understood that the present invention should not be limited to the embodiments and may be modified in various ways.

In the drawings, to clearly and briefly explain the embodiments of the present invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the embodiments of the present invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a method for manufacturing a solar cell according to an embodiment of the present invention will be described in detail with reference to the accompanying drawings. An example of a solar cell manufactured using a method for manufacturing a solar cell according to the embodiment of the present invention will be described, and then, the manufacturing method of the solar cell will be described.

Figure 2:
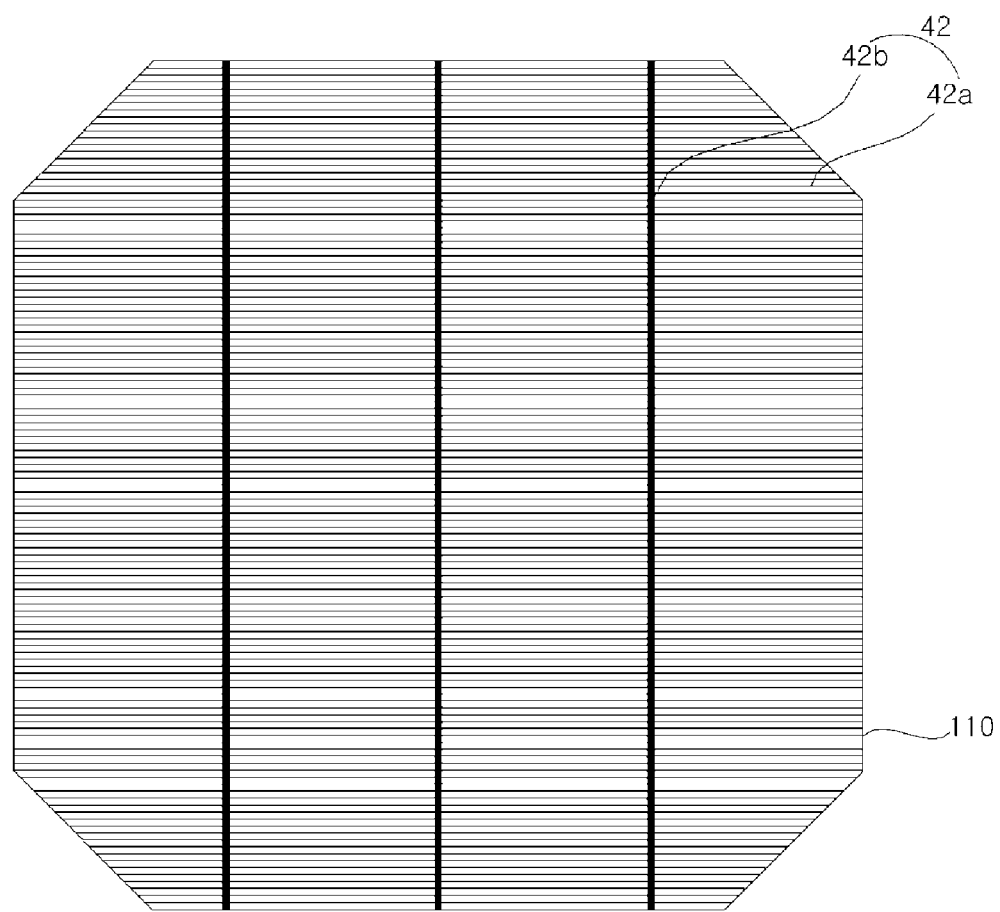
FIG. 2 is a plan view showing the front of the solar cell shown in FIG. 1 according to an embodiment of the present invention.

FIG. 1 is a sectional view showing an example of a solar cell manufactured using a manufacturing method of a solar cell according to an embodiment of the present invention, and FIG. 2 is a plan view showing the front of the solar cell shown in FIG. 1. A semiconductor substrate and an electrode are mainly shown in FIG. 2.

Referring to FIG. 1, a solar cell 100 according to this embodiment includes a semiconductor substrate 110 including a base region 10, a first conductive region 20 of a first conductive type, a second conductive region 30 of a second conductive type, a first electrode 42 connected to the first conductive region 20, and a second electrode 44 connected to the second conductive region 30. The solar cell 100 may further include dielectric (or insulating) films, such as a first passivation film 22 and an anti-reflection film 24. Hereinafter, the solar cell 100 will be described in more detail.

The semiconductor substrate 110 may be formed of a crystalline semiconductor. For example, the semiconductor substrate 110 may be formed of a single crystalline semiconductor (e.g. single crystalline silicon) or a polycrystalline semiconductor (e.g. polycrystalline silicon). In particular, the semiconductor substrate 110 may be formed of a single crystalline semiconductor (e.g. a single crystalline semiconductor wafer, more specifically a single crystalline silicon wafer). In an instance in which the semiconductor substrate 110 is formed of a single crystalline semiconductor (e.g. single crystalline silicon) as described above, the solar cell 100 may be a single crystalline semiconductor solar cell (e.g. a single crystalline silicon solar cell). Since the solar cell 100 is based on the semiconductor substrate 110 formed of a crystalline semiconductor exhibiting high crystallinity and thus low defectiveness as described above, the solar cell 100 may exhibit excellent electrical characteristics.

The front surface and/or the back surface of the semiconductor substrate 110 may be textured such that the front surface and/or the back surface of the semiconductor substrate 110 have a rugged shape. For example, the rugged shape may be a pyramidal shape, formed at a (111) surface of the semiconductor substrate 110, having an irregular size. In an instance in which the rugged shape is formed at the front surface of the semiconductor substrate 110 by texturing as described above, the surface roughness of the semiconductor substrate 110 may be increased with the result that the reflectance of light incident upon the front surface of the semiconductor substrate 110 may be decreased. Consequently, the quantity of light reaching a pn junction formed by the base region 10 and the first conductive region 20 may be increased with the result that light loss of the solar cell 100 may be minimized. In this embodiment of the present invention, the rugged shape is formed at the front surface of the semiconductor substrate 110 to decrease the reflectance of incident light, whereas the rugged shape is not formed at the back surface of the semiconductor substrate 110 to increase the reflectance of incident light. However, the embodiments of the present invention are not limited thereto. For example, the rugged shape may be formed at both the front surface and the back surface of the semiconductor substrate 110, or the rugged shape may not be formed at either the front surface or the back surface of the semiconductor substrate 110.

The base region 10 of the semiconductor substrate 110 may be a second conductive base region 10 having a relatively low doping concentration of a second conductive dopant. For example, the base region 10 may be more distant from the front surface of the semiconductor substrate 110 and more adjacent to the back surface of the semiconductor substrate 110 than the first conductive region 20. In addition, the base region 10 may be more adjacent to the front surface of the semiconductor substrate 110 and more distant from the back surface of the semiconductor substrate 110 than the second conductive region 30. However, the embodiments of the present invention are not limited thereto. The base region 10 may be differently positioned.

The base region 10 may be formed of a crystalline semiconductor having a second conductive dopant. For example, the base region 10 may be formed of a single crystalline semiconductor (e.g. single crystalline silicon) or a polycrystalline semiconductor (e.g. polycrystalline silicon) having a second conductive dopant. In particular, the base region 10 may be formed of a single crystalline semiconductor (e.g. a single crystalline semiconductor wafer, more specifically a single crystalline silicon wafer) having a second conductive dopant.

The second conductive type may be an n-type or a p-type. In an instance in which the base region 10 is of an n-type, the base region 10 may be formed of a single crystalline semiconductor or a polycrystalline semiconductor doped with a group-V element, such as phosphorus (P), arsenic (As), bismuth (Bi), or antimony (Sb). On the other hand, in an instance in which the base region 10 is of a p-type, the base region 10 may be formed of a single crystalline semiconductor or a polycrystalline semiconductor doped with a group-III element, such as boron (B), aluminum (Al), gallium (Ga), or Indium (In). However, the embodiments of the present invention are not limited thereto. The base region 10 and the second conductive dopant may be formed of various materials.

For example, the base region 10 may be of a p-type. In this instance, materials included in the second electrode 44 may be diffused in to the semiconductor substrate 110 to form the second conductive region 30 at an operation of firing the second electrode 44. As a result, an additional doping process for forming the second conductive region 30 may be omitted, thereby simplifying a manufacturing process of the solar cell 100. However, the embodiments of the present invention are not limited thereto. For example, the base region 10 and the second conductive region 30 may be of a p-type, and the first conductive region 20 may be of an n-type.

The first conductive region 20 of the first conductive type, which is opposite to the second conductive type of the base region 10, may be formed at the front surface of the semiconductor substrate 110. The first conductive region 20 may form a pn junction together with the base region 10 to constitute an emitter region for generating carriers through photoelectric conversion.

In this embodiment of the present invention, the first conductive region 20 may be a doped region constituting a portion of the semiconductor substrate 110. In this instance, the first conductive region 20 may be formed of a crystalline semiconductor having a first conductive dopant. For example, the first conductive region 20 may be formed of a single crystalline semiconductor (e.g. single crystalline silicon) or a polycrystalline semiconductor (e.g. polycrystalline silicon) having a first conductive dopant. In particular, the first conductive region 20 may be formed of a single crystalline semiconductor (e.g. a single crystalline semiconductor wafer, more specifically a single crystalline silicon wafer) having a first conductive dopant. In an instance in which the first conductive region 20 constitutes a portion of the semiconductor substrate 110 as described above, junction characteristics between the first conductive region 20 and the base region 10 may be improved.

However, the embodiments of the present invention are not limited thereto. For example, the first conductive region 20 may be formed on the semiconductor substrate 110 separately from the semiconductor substrate 110, which will hereinafter be described in more detail with reference to FIG. 9.

The first conductive type may be a p-type or an n-type. In an instance in which the first conductive region 20 is of a p-type, the first conductive region 20 may be formed of a single crystalline semiconductor or a polycrystalline semiconductor doped with a group-III element, such as boron (B), aluminum (Al), gallium (Ga), or Indium (In). On the other hand, in an instance in which the first conductive region 20 is of an n-type, the first conductive region 20 may be formed of a single crystalline semiconductor or a polycrystalline semiconductor doped with a group-V element, such as phosphorus (P), arsenic (As), bismuth (Bi), or antimony (Sb). However, the embodiments of the present invention are not limited thereto. Various materials may be used as the first conductive dopant.

In the figure, the first conductive region 20 is shown as having a homogeneous structure of a generally uniform doping concentration. However, the embodiments of the present invention are not limited thereto. In another embodiment of the present invention, the first conductive region 20 may have a selective structure, which will hereinafter be described in detail with reference to FIG. 8.

The second conductive region 30 of the second conductive type, which is the same as the second conductive type of the base region 10, having a higher doping concentration of a second conductive dopant than the base region 10, may be formed at the back surface of the semiconductor substrate 110. The second conductive region 30 may form a back surface field to constitute a back surface field region for preventing loss of the carriers due to recombination at the surface of the semiconductor substrate 110 (more exactly, the back surface of the semiconductor substrate 110).

In this embodiment of the present invention, the second conductive region 30 may be a doped region constituting a portion of the semiconductor substrate 110. In this instance, the second conductive region 30 may be formed of a crystalline semiconductor having a second conductive dopant. For example, the second conductive region 30 may be formed of a single crystalline semiconductor (e.g. single crystalline silicon) or a polycrystalline semiconductor (e.g. polycrystalline silicon) having a second conductive dopant. In particular, the second conductive region 30 may be formed of a single crystalline semiconductor (e.g. a single crystalline semiconductor wafer, more specifically a single crystalline silicon wafer) having a second conductive dopant. In an instance in which the second conductive region 30 constitutes a portion of the semiconductor substrate 110 as described above, junction characteristics between the second conductive region 30 and the base region 10 may be improved.

However, the embodiments of the present invention are not limited thereto. For example, the second conductive region 30 may be formed on the semiconductor substrate 110 separately from the semiconductor substrate 110, which will hereinafter be described in more detail with reference to FIG. 9.

The second conductive type may be an n-type or a p-type. In an instance in which the second conductive region 30 is of an n-type, the second conductive region 30 may be formed of a single crystalline semiconductor or a polycrystalline semiconductor doped with a group-V element, such as phosphorus (P), arsenic (As), bismuth (Bi), or antimony (Sb). On the other hand, in an instance in which the second conductive region 30 is of a p-type, the second conductive region 30 may be formed of a single crystalline semiconductor or a polycrystalline semiconductor doped with a group-III element, such as boron (B), aluminum (Al), gallium (Ga), or Indium (In). However, the embodiments of the present invention are not limited thereto. Various materials may be used as the second conductive dopant. The second conductive dopant of the second conductive region 30 may be formed of a material identical to that of the second conductive dopant of the base region 10 or a material different from that of the second conductive dopant of the base region 10.

In this embodiment of the present invention, the second conductive region 30 is shown as having a homogeneous structure of a generally uniform doping concentration. However, the embodiments of the present invention are not limited thereto. In another embodiment of the present invention, the second conductive region 30 may have a selective structure or a local structure, which will hereinafter be described in detail with reference to FIG. 8.

In this embodiment of the present invention, the first and second conductive regions 20 and 30 formed at the semiconductor substrate 110 are doped with the first and second conductive dopants, and the base region 10 is doped with the second conductive dopant. As a result, the dopants are distributed throughout the semiconductor substrate 110. At this time, any specific dopant may be combined with a different material or element in the semiconductor substrate 110 to lower the characteristics of the solar cell 100. For example, in an instance in which the semiconductor substrate 110 has boron (B) as a dopant, boron (B) may react with oxygen (O) to form a B—O combination. Such a B—O combination may greatly reduce lifetime of the carriers, thereby lowering (or degrading) the characteristics of the solar cell 100. Particularly, in an instance in which boron (B) is used as the second conductive agent included in the base region 10, and therefore the base region 10 is of a p-type, a large amount of the B—O combination may be distributed over the large area of the semiconductor substrate 110, thereby greatly lowering the characteristics of the solar cell 100.

In this embodiment of the present invention, therefore, a post-processing operation (ST50) (see FIG. 3) may be carried out such that any combination (e.g. the above-mentioned B—O combination) which may lower the characteristics of the solar cell 100 is not generated to prevent lowering of the characteristics of the solar cell 100, which will hereinafter be described in more detail when describing a method of manufacturing the solar cell 100.

The semiconductor substrate 110 may have a thickness T1 of about 200 μm or less. If the thickness T1 of the semiconductor substrate 110 is greater than 200 µm, it may be difficult for effects obtained by carrying out the post-processing operation (ST50) to be exhibited throughout the semiconductor substrate 110. For example, the semiconductor substrate 110 may have a thickness T1 of 100 µm to 200 µm. If the thickness T1 of the semiconductor substrate 110 is less than 100 µm, the efficiency of the solar cell 100 may be decreased and the mechanical characteristics of the solar cell 100 may not be sufficient since the thickness T1 of the semiconductor substrate 110 is insufficient to perform photoelectric conversion. However, the embodiments of the present invention are not limited thereto. The thickness T1 of the semiconductor substrate 110 may be variously changed.

The first passivation film 22 and the anti-reflection film 24 are sequentially formed on the front surface of the semiconductor substrate 110, more exactly on the first conductive region 20 formed on the semiconductor substrate 110, and the first electrode 42 is formed at the first conductive region 20 in contact through the first passivation film 22 and the anti-reflection film 24 (i.e. via an opening 102 formed through the first passivation film 22 and the anti-reflection film 24).

The first passivation film 22 and the anti-reflection film 24 may be substantially formed throughout the front surface of the semiconductor substrate 110 excluding the opening 102 corresponding to the first electrode 42.

The first passivation film 22 is formed at the first conductive region 20 in contact to passivate defects existing on the surface of the first conductive region 20 or in a bulk of the first conductive region 20. The passivation of defects may remove a recombination site of minority carriers, which may increase an open-circuit voltage Voc of the solar cell 100. The anti-reflection film 24 reduces the reflectance of light incident upon the front surface of the semiconductor substrate 110. Through reduction in the reflectance of light incident upon the front surface of the semiconductor substrate 110, the quantity of light reaching the pn junction formed by the base region 10 and the first conductive region 20 may be increased with the result that a short-circuit current Isc of the solar cell 100 may be increased. As described above, the first passivation film 22 and the anti-reflection film 24 may increase the open-circuit voltage and the short-circuit current of the solar cell 100, thereby improving the efficiency of the solar cell 100.

The first passivation film 22 may be formed of various materials. For example, the first passivation film may be formed of a dielectric material including hydrogen. In an instance in which the first passivation film 22 includes hydrogen as described above, the first passivation film 22 may function to passivate the surface of the semiconductor substrate 110 and, in addition, function as a hydrogen source for supplying hydrogen to the surface of the semiconductor substrate 110 or into a bulk of the semiconductor substrate 110 at the post-processing operation (ST50).

For example, the first passivation film 22 may include $10^{20}$ to $10^{22}$ ea/cm$^3$ of hydrogen. The hydrogen content of the first passivation film 22 is limited to a range in which the first passivation film 22 can effectively function as the hydrogen source when the first passivation film 22 passivates the surface of the semiconductor substrate 110 and at the post-processing operation (ST50). However, the embodiments of the present invention are not limited thereto. The hydrogen content of the first passivation film 22 may be variously changed.

For example, the first passivation film 22 may include a silicon nitride (SiNx:H) including hydrogen, a silicon oxide nitride (SiOxNy:H) including hydrogen, a silicon carbide (SiCx:H) including hydrogen, or a silicon oxide (SiOx:H) including hydrogen. However, the embodiments of the present invention are not limited thereto. The first passivation film 22 may include various other materials.

The first passivation film 22 may have a thickness of 50 nm to 200 nm. If the thickness of the first passivation film 22 is less than 50 nm, the passivation effect may not be sufficient, and the hydrogen diffusion effect at the post-processing operation (ST50) may not be sufficient. On the other hand, if the thickness of the first passivation film 22 is greater than 200 nm, the process time may be increased while the effects are not greatly improved, and the thickness of the solar cell 100 may be increased. However, the embodiments of the present invention are not limited thereto. The thickness of the first passivation film 22 may be variously changed.

The anti-reflection film 24 may be formed of various materials. For example, the anti-reflection film 24 may have a single film structure or a multi-layer film structure formed of at least one selected from a group consisting of a silicon nitride, a silicon nitride including hydrogen, a silicon oxide, a silicon oxide nitride, an aluminum oxide, MgF$_2$, ZnS, TiO$_2$, and CeO$_2$. For example, the anti-reflection film 24 may include a silicon nitride.

In this embodiment of the present invention, the anti-reflection film 24 formed at the semiconductor substrate 110 in contact includes hydrogen such that the anti-reflection film 24 can effectively function to passivate the surface of the semiconductor substrate 110 and function as the hydrogen source. However, the embodiments of the present invention are not limited thereto. For example, only the anti-reflection film 24 may include hydrogen, or both the anti-reflection film 24 and the first passivation film 22 may include hydrogen. In an instance in which the anti-reflection film 24 includes hydrogen, the material, hydrogen content, thickness, etc. of the anti-reflection film 24 may be equal to or similar to those of the first passivation film 22.

Furthermore, in this embodiment of the present invention, the first passivation film 22, which is a dielectric film disposed at the front surface of the semiconductor substrate 110, includes hydrogen such that the first passivation film 22 can supply the hydrogen at the post-processing operation (ST50). This is because a short-wavelength light is easily incident upon the front surface of the semiconductor substrate 110 with the result that undesired combination (e.g. the above-mentioned B—O combination) may be highly generated, whereas generation of undesired combination is advantageously prevented when hydrogen is supplied to the front surface of the semiconductor substrate 110. However, the embodiments of the present invention are not limited thereto. For example, a dielectric film formed on the front surface and/or the back surface of the semiconductor substrate 110 may include hydrogen such that the dielectric film can supply the hydrogen at the post-processing operation (ST50).

In addition, in the above-described embodiment of the present invention, both the first passivation film 22 and the anti-reflection film 24 are included. However, the embodiments of the present invention are not limited thereto. For example, any one selected from between the first passivation film 22 and the anti-reflection film 24 may perform both a reflection preventing function and a passivation function in a state in which the other selected from between the first passivation film 22 and the anti-reflection film 24 is not provided. In another example, various films may be formed on the front surface of the semiconductor substrate 110 in addition to the first passivation film 22 and the anti-reflection film 24. Various other modifications are also possible.

The first electrode 42 is electrically connected to the first conductive region 20 through the first passivation film 22 and the anti-reflection film 24 (i.e. via the opening 102 formed through the first passivation film 22 and the anti-reflection film 24). The first electrode 42 may be formed of various materials such that the first electrode 42 can have various shapes. The shape of the first electrode 42 will hereinafter be described with reference to FIG. 2.

The second electrode 44 is formed on the back surface of the semiconductor substrate 110, more exactly on the second conductive region 30 formed on the semiconductor substrate 110. In this embodiment of the present invention, the second electrode 44 is formed throughout the back surface of the semiconductor substrate 110 such that light can be reflected by the back surface of the semiconductor substrate 110. In this instance, light reaching the back surface of the semiconductor substrate 110 is reflected to the interior of the semiconductor substrate 110, thereby improving the efficiency in use of the light. At this time, the second electrode 44 may be formed at the back surface of the semiconductor substrate 110 or the second conductive region 30 in contact.

In this embodiment of the present invention, materials included in the second electrode 44 may be diffused into the semiconductor substrate 110 to form the second conductive region 30 at the operation of firing the second electrode 44. As a result, an additional doping process for forming the second conductive region 30 may be omitted, thereby simplifying the manufacturing process of the solar cell 100. In addition, damage to the semiconductor substrate 110 or defects of the semiconductor substrate 110, which may occur at a process of forming the second conductive region 30 through doping, may be prevented.

Hereinafter, the planar shape of the first electrode 42 will be described in detail with reference to FIG. 2.

Referring to FIG. 2, the first electrode 42 may include a plurality of finger electrodes 42a arranged at a uniform pitch such that the finger electrodes 42a are spaced apart from each other. In the figure, the finger electrodes 42a are illustrated as being parallel to each other and, in addition, parallel to the edge of the semiconductor substrate 110. However, the embodiments of the present invention are not limited thereto. The first electrode 42 may further include at least one bus bar electrode 42b formed in a direction intersecting the finger electrodes 42a for interconnecting the finger electrodes 42a. Only one bus bar electrode 42b may be provided, or a plurality of bus bar electrodes 42b arranged at a larger pitch than the finger electrodes 42a may be provided as shown in FIG. 2. In this instance, the width of each of the bus bar electrodes 42b may be greater than that of each of the finger electrodes 42a. However, the embodiments of the present invention are not limited thereto. For example, the width of each of the bus bar electrodes 42b may be equal to or less than that of each of the finger electrodes 42a.

When viewed in section, the finger electrodes 42a and the bus bar electrodes 42b of the first electrode 42 may be formed through the first passivation film 22 and the anti-reflection film 24. That is, the opening 102 may be formed through the first passivation film 22 and the anti-reflection film 24 such that the opening 102 corresponds to the finger electrodes 42a and the bus bar electrodes 42b. In another example, the finger electrodes 42a of the first electrode 42 may be formed through the first passivation film 22 and the anti-reflection film 24, and the bus bar electrodes 42b of the first electrode 42 may be formed on the first passivation film 22 and the anti-reflection film 24. In this instance, the opening 102 may be formed through the first passivation film 22 and the anti-reflection film 24 such that the opening 102 corresponds to the finger electrodes 42a but not the bus bar electrodes 42b.

The solar cell 100 may be processed so as to prevent generation of any combination which may lower the characteristics of the solar cell 100 at the post-processing operation (ST50) as previously described, which will hereinafter be described in more detail when describing a manufacturing method of the solar cell 100.

Figure 3:
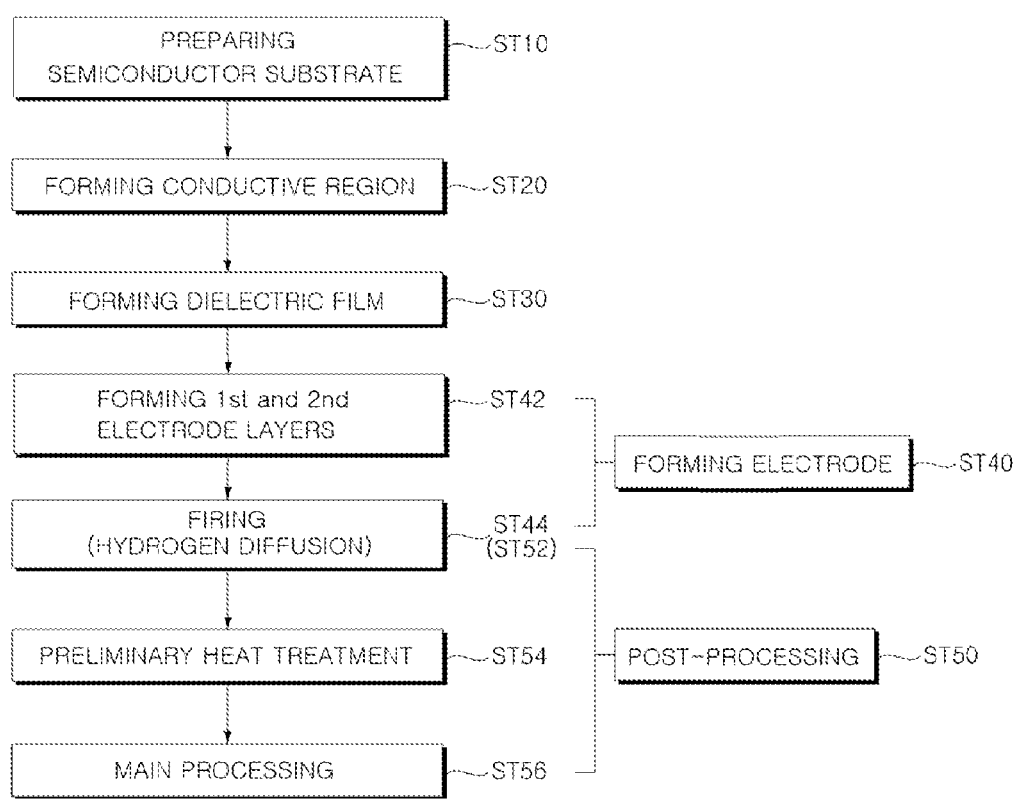
FIG. 3 is a flowchart showing a manufacturing method of a solar cell according to an embodiment of the present invention.

FIG. 3 is a flowchart showing a manufacturing method of a solar cell according to an embodiment of the present invention, and FIGS. 4A to 4G are sectional views showing the manufacturing method of the solar cell shown in FIG. 3. A detailed description will not be given of parts of the solar cell shown in FIGS. 3 and 4A to 4G identical to or similar to those of the solar cell 100 described with reference to FIGS. 1 and 2. Hereinafter, only parts of the solar cell shown in FIGS. 3 and 4A to 4G different from those of the solar cell 100 described with reference to FIGS. 1 and 2 will be described in more detail.

Referring to FIG. 3, the manufacturing method of the solar cell 100 according to the embodiment of the present invention includes a semiconductor substrate preparing operation (ST10), a conductive region forming operation (ST20), a dielectric film forming operation (ST30), an electrode forming operation (ST40), and a post-processing operation (ST50). The electrode forming operation (ST40) may include an operation of forming first and second electrode layers (ST42) and a firing operation (ST44). The post-processing operation (ST50) may include a hydrogen diffusion process (ST52), a preliminary heat treatment process (ST54), and a main processing process (ST56). The firing operation (ST44) and the hydrogen diffusion process (ST52) may be simultaneously carried out. The manufacturing method of the solar cell 100 according to the embodiment of the present invention will be described in detail with reference to FIGS. 4A to 4G.

Figure 4A:
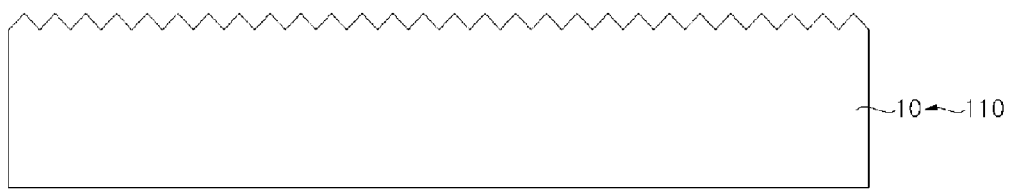
FIGS. 4A to 4G are sectional views showing the manufacturing method of the solar cell shown in FIG. 3 according to an embodiment of the present invention.

First, as shown in FIG. 4A, a semiconductor substrate 110 including a base region 10 having a second conductive dopant is prepared at the semiconductor substrate preparing operation (ST10). For example, in this embodiment of the present invention, the semiconductor substrate 110 may be formed of a silicon substrate (e.g. a silicon wafer) having a p-type dopant (specifically boron (B)). However, the embodiments of the present invention are not limited thereto. For example, the base region 10 may have a p-type dopant other than boron or an n-type dopant.

At this time, the front surface and/or the back surface of the semiconductor substrate 110 may be textured such that a front surface and/or the back surface of the semiconductor substrate 110 has a rugged shape (irregular or textured shape). The surface of the semiconductor substrate 110 may be textured using wet texturing or dry texturing. In the wet texturing, the semiconductor substrate 110 is soaked in a texturing solution. The wet texturing has an advantage in that process time is short. In the dry texturing, on the other hand, the surface of the semiconductor substrate 110 is cut using a diamond grill or laser. In the dry texturing, a rugged shape is uniformly formed. However, process time is long, and the semiconductor substrate 110 may be damaged. Alternatively, the semiconductor substrate 110 may be textured using reactive ion etching (RIE), etc. As described above, the semiconductor substrate 110 may be textured using various methods.

For example, the front surface of the semiconductor substrate 110 may be textured such that the front surface of the semiconductor substrate 110 has a rugged shape, and the back surface of the semiconductor substrate 110 may be mirror-ground to have a lower surface roughness than the front surface of the semiconductor substrate 110. However, the embodiments of the present invention are not limited thereto. The semiconductor substrate 110 may have various other structures.

Figure 4B:
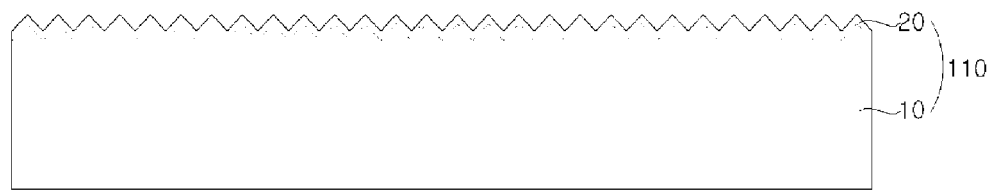

Subsequently, as shown in FIG. 4B, a conductive region is formed at the semiconductor substrate 110 at the conductive region forming operation (ST20). More specifically, in this embodiment of the present invention, a first conductive region 20 is formed at the front surface of the semiconductor substrate 110 at the conductive region forming operation, and a second conductive region 30 (see FIG. 4E), which will be positioned at the back surface of the semiconductor substrate 110, is formed at a subsequent operation of firing a second electrode 44. However, the embodiments of the present invention are not limited thereto. For example, the first conductive region 20 and/or the second conductive region 30 may be formed at the conductive region forming operation. In this instance, the second conductive region 30 may be formed using a method identical to or similar to a method of forming the first conductive region 20, which will hereinafter be described.

The first conductive region 20 may be formed by doping a dopant using various methods, such as ion injection, thermal diffusion, and laser doping. In another example, an additional layer having a first conductive dopant may be formed on the semiconductor substrate 110 to form the first conductive region 20.

Figure 4C:
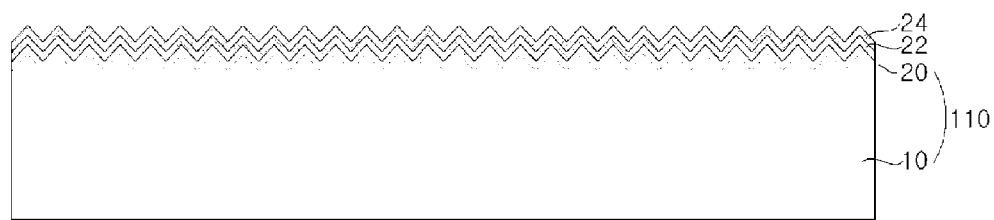

Subsequently, as shown in FIG. 4C, a dielectric film is formed on the front surface of the semiconductor substrate 110 or on the first conductive region 20 at the dielectric film forming operation (ST30).

More specifically, a first passivation film 22 and an anti-reflection film 24 are formed on the first conductive region 20. In this embodiment of the present invention, no dielectric film is positioned at the back surface of the semiconductor substrate 110. Alternatively, another dielectric film (e.g. a second passivation film) may be positioned at the back surface of the semiconductor substrate 110. The dielectric film may also be formed at the back surface of the semiconductor substrate 110 at this operation. In this instance, the dielectric film may also be formed on the back surface of the semiconductor substrate 110 using a method identical to or similar to a method of forming the first passivation film 22 and the anti-reflection film 24, which will hereinafter be described.

The first passivation film 22 and/or the anti-reflection film 24 may be formed using various methods, such as vacuum deposition, chemical vapor deposition, spin coating, screen printing, and spray coating.

In this embodiment of the present invention, the first passivation film 22 may be formed of a dielectric material including hydrogen. As a result, the first passivation film 22 may function to passivate the surface of the semiconductor substrate 110 using hydrogen and, in addition, function as a hydrogen source for supplying hydrogen to the semiconductor substrate 110 at the post-processing operation (ST50).

Figure 4D:
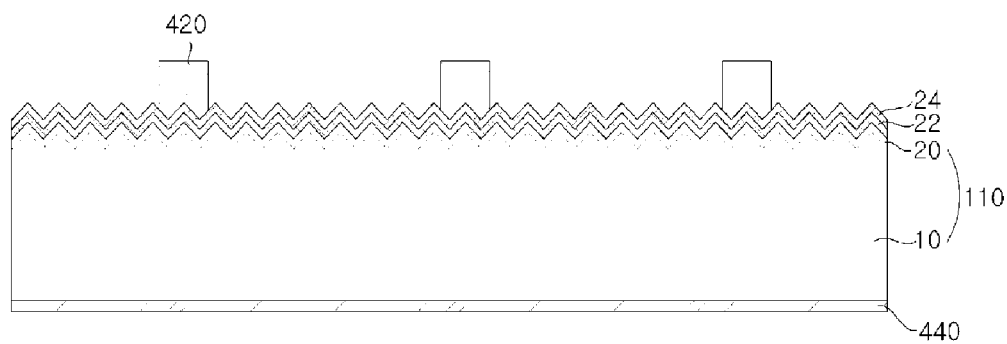
Figure 4E:
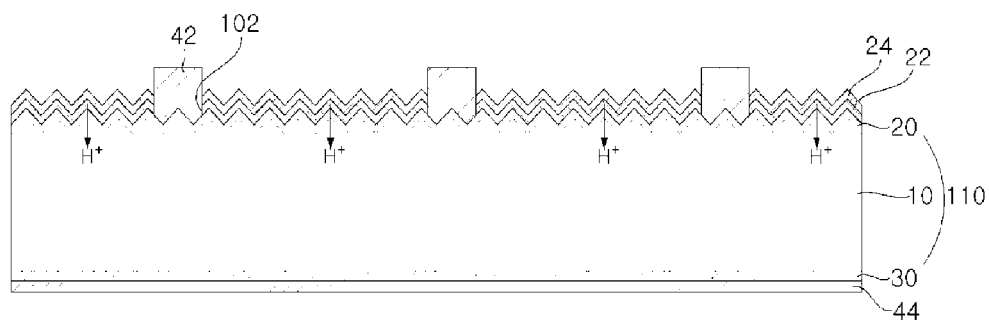

Subsequently, as shown in FIGS. 4D and 4E, first and second electrodes 42 and 44 are formed at the electrode forming operation (ST40), which will hereinafter be described in more detail.

First, as shown in FIG. 4D, a paste for forming first and second electrodes is applied onto the dielectric films, such as the first passivation film 22 and the anti-reflection film 24, or the semiconductor substrate 110 by printing (e.g. screen printing) to form first and second electrode layers 420 and 440 at the operation of forming the first and second electrode layers (ST42). The first and second electrode layers 420 and 440 may be formed using various other methods or processes.

Subsequently, as shown in FIG. 4E, the first and second electrode layers 420 and 440 are fired or heated to form first and second electrodes 42 and 44 at the firing operation (ST44).

During firing, an opening 102 is formed through the dielectric films, such as the first passivation film 22 and the anti-reflection film 24, by firing through or laser firing contact with the result that the first electrode layer 420 is connected to (e.g. contacts) the first conductive region 20. In an instance in which the firing through or the laser firing contact is used as described above, the opening 102 is formed during firing. As a result, it is not necessary to carry out an additional process of forming the opening 102.

In addition, a material (e.g. aluminum) constituting the second electrode 44 may be diffused to the back surface of the semiconductor substrate 110 to form the second conductive region 30 at the semiconductor substrate 110. However, the embodiments of the present invention are not limited thereto. For example, the second conductive region 30 may be formed at the conductive region forming operation (ST20) as previously described.

For example, at the firing operation (ST44), temperature (specifically, peak temperature) may be 700 to 800° C., and process time may be 5 to 20 seconds. These conditions are limited to a range in which process time can be minimized while firing is sufficiently achieved. However, the embodiments of the present invention are not limited thereto. In addition, the firing operation (ST44) may be carried out using heat generated from an ultraviolet lamp. However, the embodiments of the present invention are not limited thereto. Various other methods may also be used.

As described above, in this embodiment of the present invention, the electrode forming operation (ST40) includes the firing operation (ST44). The firing operation (ST44) may be a part of the post-processing operation (S50), which will be subsequently carried out. That is, the firing operation (ST44) and a part of the post-processing operation (S50) may be simultaneously carried out, which will hereinafter be described in more detail when describing the post-processing operation (S50).

However, the embodiments of the present invention are not limited thereto. The electrode forming operation (ST40) may not include the firing operation (ST44). For example, the opening 102 may be formed through the first passivation film 22 and the anti-reflection film 24, the opening 102 may be filled with a conductive material using various methods, such as plating and deposition, to form the first electrode 42, and the second electrode 44 may be formed using various methods, such as plating, deposition, and printing. In addition, the first electrode 42 and the second electrode 44 may be formed using various other methods.

Subsequently, the post-processing operation (S50) is carried out to post-process the solar cell 100 including the semiconductor substrate 110 by passivating the semiconductor substrate 110. More specifically, the post-processing operation (S50) is carried out to prevent lowering in characteristics of the solar cell 100 which may be caused due to a specific combination generated at the surface of the semiconductor substrate 110 or in the bulk of the semiconductor substrate 110. For example, in an instance in which the semiconductor substrate 110 includes boron, the B—O combination may be easily generated in the semiconductor substrate 110 when light is supplied to the semiconductor substrate 110. Such a B—O combination may greatly reduce the lifetime of the carriers, thereby lowering the characteristics of the solar cell 100. In this embodiment of the present invention, therefore, the post-processing operation (S50) is carried out such that specific combination (e.g. the B—O combination) which may lower the characteristics of the solar cell 100 is not generated in the semiconductor substrate 110 as described above, thereby improving the characteristics of the solar cell 100.

In an instance in which the semiconductor substrate 110 is heat-treated at a high temperature after the post-processing operation (S50), the effects obtained by the post-processing operation (S50) may be lowered or disappear. For this reason, the post-processing operation (S50) may be carried out in the second half of the manufacturing method of the solar cell 100. Specifically, the post-processing operation (S50) may be carried out simultaneously with the firing operation (ST44) or after the firing operation (ST44), which is carried out at a relatively high temperature. For example, a part of the post-processing operation (S50) may be carried out simultaneously with the firing operation (ST44), and the rest of the post-processing operation (S50) may be carried out after the firing operation (ST44). Alternatively, the entirety of the post-processing operation (S50) may be carried out after the firing operation (ST44). As a result, the effects obtained by the post-processing operation (S50) may not be lowered or disappear. The post-processing operation (S50) will hereinafter be described in more detail.

The post-processing operation (S50) includes the main processing process (ST56), which is capable of restraining generation of combination lowering the characteristics of the solar cell 100 and generating combination (e.g. a B—H combination) which may not badly affect the characteristics of the solar cell 100 through heat treatment of the semiconductor substrate together with the supply of light to the semiconductor substrate. In addition, the post-processing operation (S50) may further include the hydrogen diffusion process (ST52) and/or the preliminary heat treatment process (ST54), which are carried out before the main processing process (ST56), for improving the effects of the main processing process (ST56). In this embodiment of the present invention, the hydrogen diffusion process (ST52), the preliminary heat treatment process (ST54), and the main processing process (ST56) are sequentially carried out to maximize the effects of the post-processing operation (S50). Hereinafter, the hydrogen diffusion process (ST52), the preliminary heat treatment process (ST54), and the main processing process (ST56) will be described in detail.

First, hydrogen is diffused in the semiconductor substrate 110 at the hydrogen diffusion process (ST52). At the hydrogen diffusion process (ST52), the semiconductor substrate 110 is heat-treated at a high temperature at which hydrogen is diffused deeply in the semiconductor substrate 110.

At this time, hydrogen may be supplied from various hydrogen sources to the semiconductor substrate 110. For example, the semiconductor substrate 110 may be placed in a furnace under a hydrogen atmosphere such that hydrogen in the hydrogen atmosphere can be supplied into the semiconductor substrate 110. In this instance, the hydrogen in the hydrogen atmosphere is a hydrogen source. Alternatively, in an instance in which the dielectric films (i.e. the first passivation film 22 and the anti-reflection film 24) formed on the semiconductor substrate 110 include hydrogen, the hydrogen from the dielectric films may be supplied into the semiconductor substrate 110 by heat treatment. In this instance, the hydrogen in the dielectric films is a hydrogen source.

In this embodiment of the present invention, the dielectric films, specifically the first passivation film contacting the semiconductor substrate 110, include hydrogen, and the hydrogen is supplied into the semiconductor substrate 110. In an instance in which the first passivation film 22 is used as a hydrogen source as described above, it is not necessary to provide a process or an apparatus for forming the hydrogen atmosphere. In addition, the first passivation film 22 may function as a kind of capping film for further accelerating the diffusion of hydrogen in the semiconductor substrate 110.

The hydrogen diffusion process (ST52) may be carried out at a temperature (more exactly, a peak temperature) of 400 to 800° C. (more specifically, 400 to 700° C.) for about 5 seconds to about 20 minutes (more specifically, about 1 to 20 minutes). If the temperature of the hydrogen diffusion process (ST52) is less than 400° C. or the process time is less than 5 seconds, hydrogen diffusion may not be sufficiently achieved. On the other hand, if the temperature of the hydrogen diffusion process (ST52) is greater than 800° C. or the process time is greater than 20 minutes, process cost and time are increased, thereby lowering productivity. In other words, hydrogen may be effectively diffused in the semiconductor substrate 110 within the above-defined temperature and time ranges, thereby achieving high productivity. In consideration of the process cost and the productivity, the temperature of the hydrogen diffusion process (ST52) may be 400 to 700° C. In consideration of the hydrogen diffusion, on the other hand, the process time may be 1 to 20 minutes. However, the embodiments of the present invention are not limited thereto. The temperature and the process time of the hydrogen diffusion process (ST52) may be variously changed.

At this time, various heat source units which are capable of uniformly maintaining the temperature of the hydrogen diffusion process (ST52) may be used. For example, an ultraviolet lamp or a resistance heating type heater may be used as a heat source unit. However, the embodiments of the present invention are not limited thereto. Various other heat source units may be used.

The temperature and the process time of the hydrogen diffusion process (ST52) may be equal to, similar to, or overlap with those of the firing operation (ST44) of the electrode forming operation (ST40). In addition, heat source units used at the hydrogen diffusion process (ST52) and the firing operation (ST44) may be identical to or similar to each other. Consequently, the hydrogen diffusion process (ST52) may be carried out simultaneously with the firing operation (ST44). That is, as shown in FIG. 4E, hydrogen diffusion may be achieved at the firing operation (ST44) without additionally carrying out the hydrogen diffusion process (ST52). Since the hydrogen diffusion process (ST52) is not additionally carried out, the process may be simplified, and process cost may be reduced. However, the embodiments of the present invention are not limited thereto. For example, the hydrogen diffusion process (ST52) may be carried out as a separate operation after the firing operation (ST44).

Figure 4F:
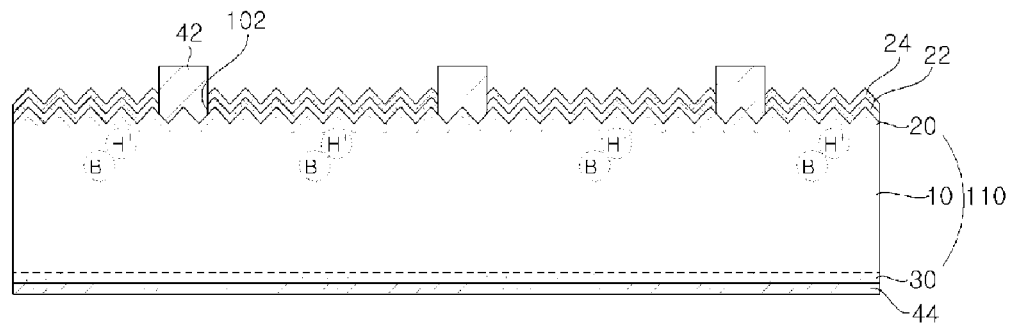

Subsequently, as shown in FIG. 4F, the preliminary heat treatment process (ST54) may be carried out to heat-treat the semiconductor substrate 110 such that hydrogen diffused in the semiconductor substrate 110 can react with a different material and element in the semiconductor substrate 110 to generate a combination including the hydrogen (or bond including the hydrogen). In particular, the hydrogen may be combined with the dopant of the semiconductor substrate 110. For example, in an instance in which the semiconductor substrate 110 includes boron as a dopant, the B—H combination, in which hydrogen and boron are combined with each other, may be generated.

At the preliminary heat treatment process (ST54), only heat treatment is carried out without additional supply of light to the semiconductor substrate with the result that the B—O combination is not generated but the B—H combination is generated. As described above, no light is supplied at the preliminary heat treatment process (ST54). Even in an instance in which natural light is supplied, the light has a light intensity of about 100 mW/cm$^2$, which is lower than that of the main processing process (ST56). However, the embodiments of the present invention are not limited thereto. The light intensity of the preliminary heat treatment process (ST54) may be changed.

The temperature of the preliminary heat treatment process (ST54) may be about 100 to 300° C., which is lower than that of the hydrogen diffusion process (ST52). As previously described, the preliminary heat treatment process (ST54) is carried out to generate the B—H combination. If the temperature of the preliminary heat treatment process (ST54) is less than 100° C., no energy for the B—H combination is provided with the result that the B—H combination may not be satisfactorily generated. On the other hand, if the temperature of the preliminary heat treatment process (ST54) is greater than 300° C., hydrogen combination is superior to the B—H combination. As a result, hydrogen combination may be generated, and the B—H combination may be decomposed. In an instance in which the temperature of the preliminary heat treatment process (ST54) is 100 to 300° C., therefore, it is possible to generate a large amount of the B—H combination through the preliminary heat treatment process (ST54).

The process time of the preliminary heat treatment process (ST54) may be about 1 to 30 minutes. If the process time of the preliminary heat treatment process (ST54) is less than 1 minute, it may be difficult to sufficiently generate the desired B—H combination. On the other hand, if the process time of the preliminary heat treatment process (ST54) is greater than 30 minutes, the process time may be increased while the effects obtained through preliminary heat treatment are not greatly improved, thereby lowering productivity. However, the embodiments of the present invention are not limited thereto. The process time of the preliminary heat treatment process (ST54) may be changed.

In an instance in which the B—H combination is generated through the preliminary heat treatment process (ST54) as described above, hydrogen exists near the surface of the semiconductor substrate 110 or in the semiconductor substrate 110 in a state in which the hydrogen is combined with boron (B), which is the dopant of the semiconductor substrate 110. In particular, a large amount of the B—H combination exists near the surface of the semiconductor substrate 110. As a result, the diffusion distance and time of hydrogen into the semiconductor substrate 110 may be reduced at the main processing process (ST56), which will be subsequently carried out.

Figure 4G:
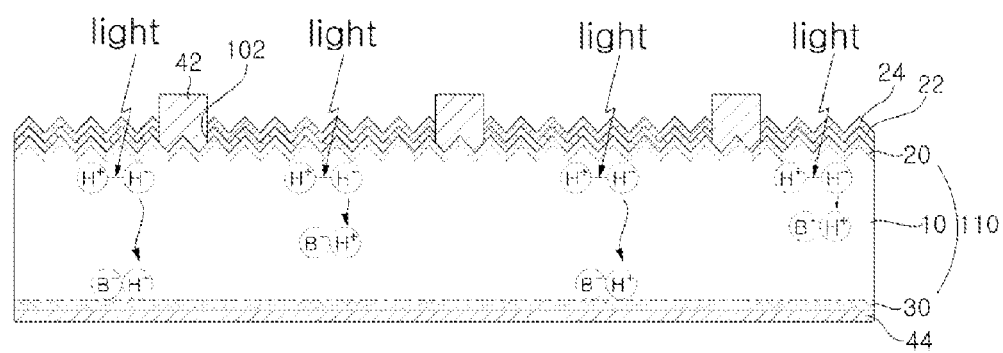

Subsequently, as shown in FIG. 4G, the semiconductor substrate 110 is heat-treated at a temperature higher than a room temperature in a state in which light is supplied to the semiconductor substrate 110 at the main processing process (ST56). In an instance in which light is supplied to the semiconductor substrate 110 at the main processing process (ST56), hydrogen may not be in an H$^+$ state, in which the hydrogen is stable, but may be in an H$^0$ or H$^-$ state, in which the hydrogen is unstable, even during a short time by carrier injection from the light. Since the hydrogen in the H$^0$ or H$^-$ state is not stable, the state of the hydrogen may be converted into the H$^+$ state, in which the hydrogen is stable, after a predetermined time.

Since the diffusion speed of the hydrogen in the H$^0$ or H$^-$ state generated by the light is much greater than that of the hydrogen in the H$^+$ state, the hydrogen may be rapidly diffused in the semiconductor substrate 110. Consequently, the hydrogen is uniformly distributed in the semiconductor substrate 110 with the result that the hydrogen functions to remove defects in the semiconductor substrate 110 or to prevent generation of undesired combination in the semiconductor substrate 110. For example, in an instance in which the hydrogen in the H$^0$ or H$^-$ state is diffused in the semiconductor substrate 110 and is then converted into the H$^+$ state, in which the hydrogen is stable, the B—H combination is generated, thereby preventing generation of the B—O combination. That is, the B—O combination, which may generated at the beginning of the main processing process (ST56) due to light emitted to the semiconductor substrate 110, may be decomposed to generate the B—H combination. After that, the B—H combination is generally predominant in the semiconductor substrate 110 with the result that the B—O combination is not generated. As described above, the B—H combination, which is distributed at the surface of the semiconductor substrate 110, may be uniformly distributed in the semiconductor substrate 110, thereby preventing generation of undesired B—O combination in the semiconductor substrate 110.

In this embodiment of the present invention, it is necessary to provide the temperature, the light intensity, and the time based on a predetermined relationship thereamong so as to convert the hydrogen in the H$^+$ state into the hydrogen in the H$^0$ or H$^-$ state, and to concretely define the relationship so as to maximize the effects of the main processing process (ST56). That is, if a predetermined light intensity and/or process time is not provided although light is supplied to the semiconductor substrate at a uniform temperature, hydrogen exists in the H$^+$ state, in which the hydrogen is stable. Only when the predetermined light intensity and/or process time is provided, the state of the hydrogen may be converted into the H$^0$ or H$^-$ state.

Figure 5:
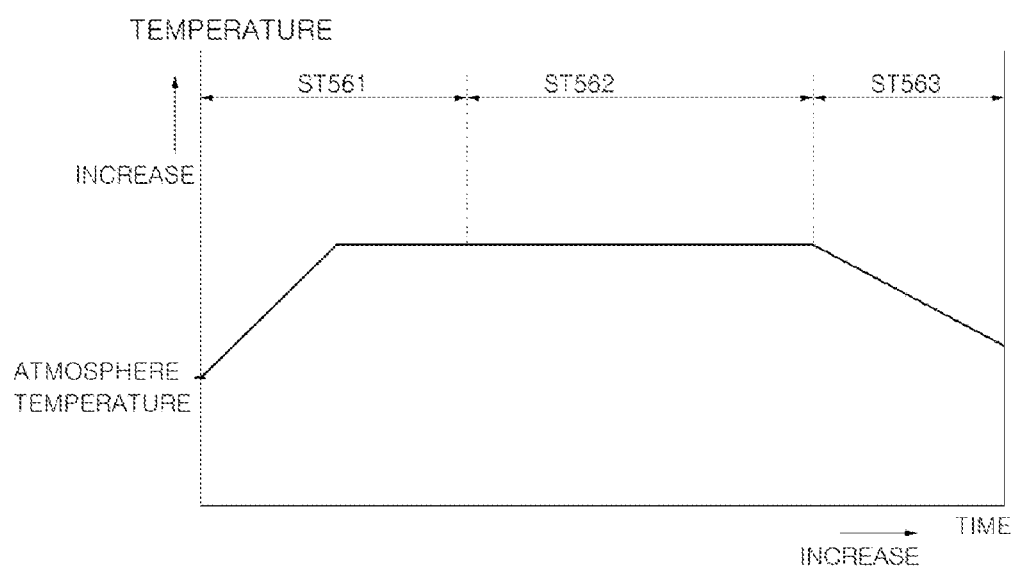
FIG. 5 is a graph showing a relationship between time and temperature of a main processing process of a post-processing operation of the manufacturing method of the solar cell according to the embodiment of the present invention.

At this time, the main processing process (ST56) may be carried out to have a time-temperature graph as shown in FIG. 5. FIG. 5 is a graph showing a relationship between time and temperature of the main processing process of the post-processing operation of the manufacturing method of the solar cell according to the embodiment of the present invention.

That is, as shown in FIG. 5, the main processing process (ST56) may include a main period (ST562) having a temperature (more specifically, a peak temperature) for hydrogen conversion. The main processing process (ST56) may further include a temperature rising period (ST561) for increasing the temperature from the room temperature to the temperature of the main period, the temperature rising period (ST561) being carried out before the main period (ST562), and a cooling period (ST563) for decreasing the temperature to the room temperature, the cooling period (ST563) being carried out after the main period (ST562). During the main processing process (ST56), therefore, the occurrence of problems caused due to abrupt change of temperature may be prevented, and a desired reaction may be stably achieved.

It is exemplified that the temperature increases up to the temperature of the main period (ST562) in the temperature rising period (ST561) before the main period (ST562) in FIG. 5. However, the invention is not limited thereto. Thus, a portion of the temperature rising period (ST561) adjacent to the main period (ST562) has a temperature equal to or similar to that of the main period (ST562). In this instance, since the temperature is maintained for a predetermined time of the main period (ST562) in the temperature rising period (ST561) before the main period (ST562), process stability of the main period (ST562) can be enhanced.

In this embodiment of the present invention, the temperature of the main processing process (ST56) means that of the main period (ST562), in which hydrogen conversion is actually achieved. The light intensity of the main processing process (ST56) may mean that of the main period (ST562), and the process time of the main processing process (ST56) may mean that of the main period (ST562), in which hydrogen conversion is actually achieved.

It is necessary that the temperature of the main processing process (ST56) be sufficient to convert hydrogen in an $H^+$ state into hydrogen in an $H^0$ or $H^-$ state and to decompose the B—O combination which may be generated due to the supply of light. For example, the temperature of the main processing process (ST56) may be 100 to 800° C. If the temperature of the main processing process (ST56) is less than 100° C., thermal energy is less than energy necessary to decompose the B—O combination with the result that the B—O combination generated due to the supply of light may survive. On the other hand, if the temperature of the main processing process (ST56) is greater than 800° C., process cost may be increased due to the high temperature. However, the embodiments of the present invention are not limited thereto.

First, a relationship between temperature and light intensity of the main processing process (ST56) for converting hydrogen in an $H^+$ state into hydrogen in an $H^0$ or $H^-$ state will be described before a relationship between light intensity and time of the main processing process (ST56) will be described.

Figure 6:
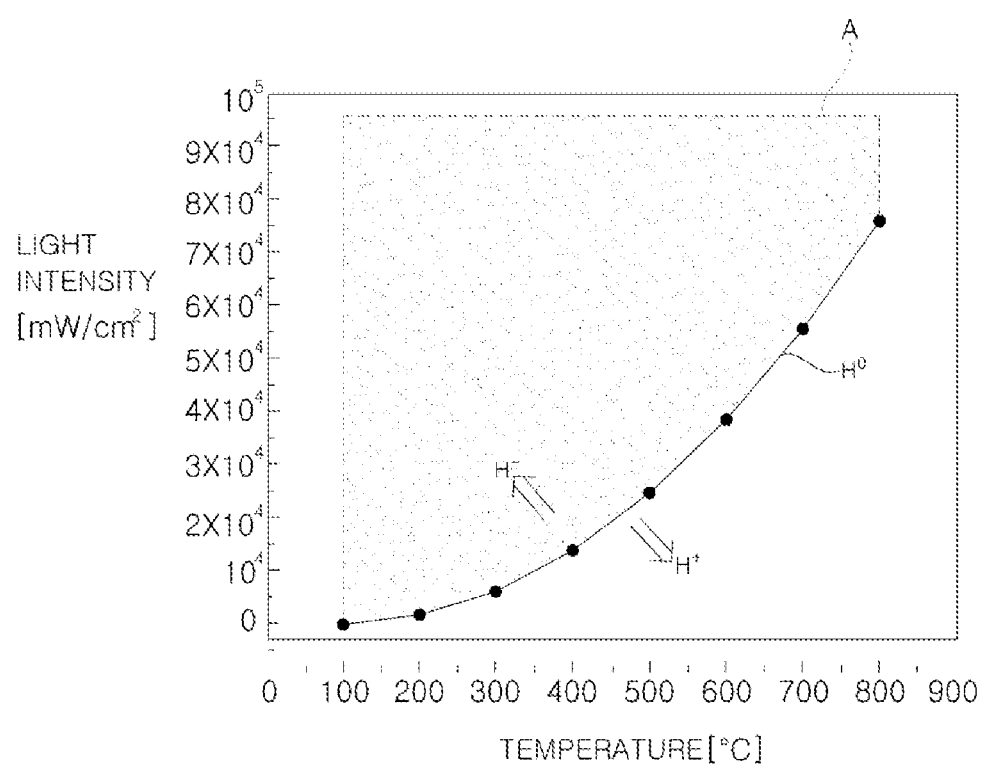
FIG. 6 is a graph showing a state of hydrogen based on a relationship between temperature and light intensity at the post-processing operation of the manufacturing method of the solar cell according to the embodiment of the present invention.

FIG. 6 is a graph showing a state of hydrogen based on a relationship between temperature and light intensity at the post-processing operation of the manufacturing method of the solar cell according to the embodiment of the present invention.

A relationship between temperature and light intensity was analyzed based on the fact that the minimum value $I_{min}$ of the light intensity necessary for hydrogen conversion varies according to temperature T of the main processing process (ST56). The results were obtained as shown in FIG. 6. It can be seen from FIG. 6 that the minimum value $I_{min}$ of the light intensity increases as the temperature T of the main processing process (ST56) increases. In this embodiment of the present invention, therefore, the minimum value $I_{min}$ of the light intensity per temperature T is represented by Equation 1.

$$I_{min}=1750-31.8 \cdot T+(0.16) \cdot T^2 \qquad \text{<Equation 1>}$$

where the unit of T is ° C., and the unit of $I_{min}$ is mW/cm².

Only in an instance in which light intensity I of light supplied simultaneously with heat treatment is equal to or greater than the minimum value $I_{min}$ of the light intensity on the assumption that the temperature T of the main processing process (ST56) has a uniform value, therefore, the state of the hydrogen may be converted into the $H^0$ or $H^-$ state. For reference, in an instance in which the temperature T is 100 to 800° C., the minimum value $I_{min}$ of the light intensity may be $1.7 \times 10^2$ mW/cm² to $7.871 \times 10^4$ mW/cm².

Consequently, the light intensity I of the light to be supplied based on the temperature T of the main processing process (ST56) may satisfy the conditions of Equation 2.

$$1750-31.8 \cdot T+(0.16) \cdot T^2 \leq I \qquad \text{<Equation 2>}$$

where the unit of T is ° C., and the unit of I is mW/cm².

In an instance in which the light intensity I of the light satisfying Equation 2 is provided at a specific temperature T of the main processing process (ST56), therefore, hydrogen in the H+ state may be converted into hydrogen in the $H^0$ or $H^-$ state. At this time, it may be difficult to acquire a desired value of the light intensity I of the light if the light intensity I is excessively high. The light intensity I may have a value of $10^5$ mW/cm² within a range of the temperature T of the main processing process (ST56). Consequently, the light intensity I to be provided based on the temperature T of the main processing process (ST56) may satisfy the conditions of Equation 3.

$$1750-31.8 \cdot T+(0.16) \cdot T^2 \leq I \leq 10^5 \qquad \text{<Equation 3>}$$

where the unit of T is ° C., and the unit of I is mW/cm².

The above-described range of the temperature T and the ranges of the temperature T and the light intensity I satisfying Equation 3 approximately correspond to a region denoted by A in FIG. 6.

Figure 7:
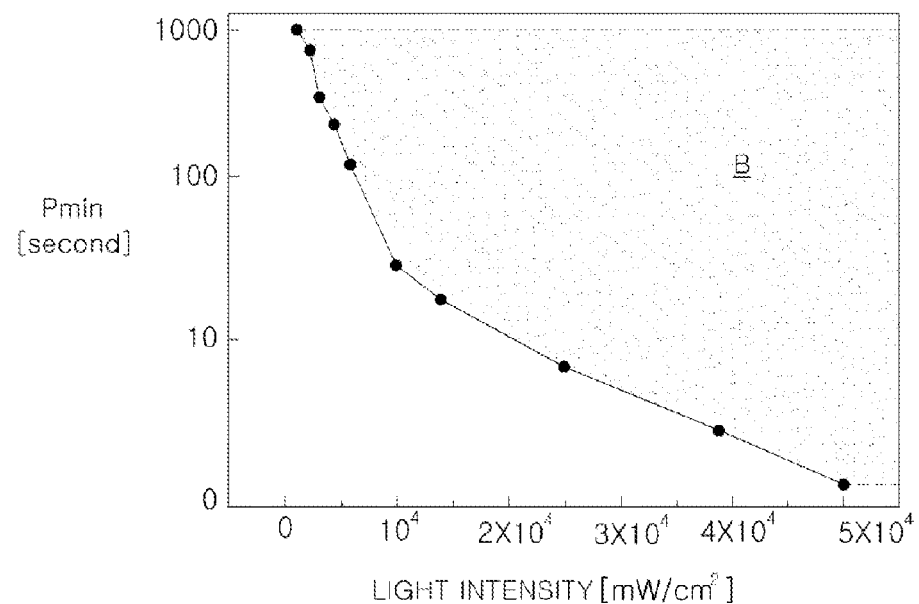
FIG. 7 is a graph showing a state of hydrogen based on a relationship between light intensity and process time at the post-processing operation of the manufacturing method of the solar cell according to the embodiment of the present invention.

A relationship between light intensity and process time was analyzed based on the fact that the minimum value $P_{min}$ of the process time necessary for hydrogen conversion (the minimum process time necessary to convert hydrogen in the H+ state into hydrogen in the $H^0$ state) varies according to the light intensity I of the main processing process (ST56). The results were obtained as shown in FIG. 7. FIG. 7 is a graph showing a state of hydrogen based on a relationship between light intensity and process time at the post-processing operation of the manufacturing method of the solar cell according to the embodiment of the present invention.

As shown in FIG. 7, the minimum value $P_{min}$ of the process time decreases as the light intensity I increases. That is, in an instance in which the light intensity I is high, a relatively short process time is needed. On the other hand, in an instance in which the light intensity I is low, a relatively long process time is needed. In this embodiment of the present invention, the minimum value $P_{min}$ of the process time based on the light intensity I approximately corresponds to Equations 4 to 7. In an instance in which the light intensity I is $5 \times 10_4$ mW/cm² or more as represented by Equation 7, the minimum process time is greatly decreased with the result that it is difficult to perform arithmetic calculation. In addition, it is difficult to carry out the process within the decreased process time. For this reason, it is assumed that the minimum value $P_{min}$ of the process time is uniform for the above-mentioned light intensity I.

$$1.7 \times 10^2 \leq I < 10^3, \text{ and } P_{min}=13000-(31.7) \cdot I+(0.02) \cdot (I)^2 \qquad \text{<Equation 4>}$$

$$10^3 \leq I < 10^4, \text{ and } P_{min}=1030-(0.25) \cdot I+(1.5 \times 10^{-5}) \cdot (I)^2 \qquad \text{<Equation 5>}$$

$$10^4 \leq I \leq 5 \times 10^4, \text{ and } P_{min}=35.5-(0.0012) \cdot I+(10^{-8}) \cdot (I)^2 \qquad \text{<Equation 6>}$$

$$5 \times 10^4 \leq I \leq 10^5, \text{ and } P_{min}=0.5 \qquad \text{<Equation 7>}$$

where the unit of I is mW/cm², and the unit of $P_{min}$ is sec.

In an instance in which the process time P of the main processing process (ST56) is equal to or greater than the minimum value $P_{min}$ of the process time when the light intensity I of the main processing process (ST56) has a uniform value, therefore, the state of the hydrogen may be effectively converted into the $H^0$ or $H^-$ state. Consequently, the process time P of the main processing process (ST56) based on the light intensity I may satisfy any one of Equations 8 to 11.

$1.7 \times 10^2 \leq I < 10^3$, and $13000 - (31.7) \cdot I + (0.02) \cdot (I)^2 \leq P$ <Equation 8>

$10^3 \leq I < 10^4$, and $1030 - (0.25) \cdot I + (1.5 \times 10^{-5}) \cdot (I)^2 \leq P$ <Equation 9>

$10^4 \leq I \leq 5 \times 10^4$, and $35.5 - (0.0012) \cdot I + (10^{-8}) \cdot (I)^2 \leq P$ <Equation 10>

$5 \times 10^4 \leq I \leq 10^5$, and $0.5 \leq P$ <Equation 11> where the unit of $I_{min}$ is mW/cm$^2$, and the unit of P is sec.

In an instance in which the process is carried out with the light intensity I of the main processing process (ST56) during the process time P satisfying Equations 8 to 11, therefore, it is possible to convert the hydrogen in the H$^+$ state into the hydrogen in the H$^0$ or H$^-$ state. At this time, productivity may be lowered if the process time P is excessively long. For this reason, the process time P of the main processing process (ST56) may have a value of 10,000 sec or less. Consequently, the process time P of the main processing process (ST56) based on the light intensity I may satisfy any one of Equations 12 to 15.

$1.7 \times 10^2 \leq I \leq 10^3$, and $13000 - (31.7) \cdot I + (0.02) \cdot (I)^2 \leq P \leq 10000$ <Equation 12>

$10^3 \leq I < 10^4$, and $1030 - (0.25) \cdot I + (1.5 \times 10^{-5}) \cdot (I)^2 \leq P \leq 10000$ <Equation 13>

$10^4 \leq I \leq 5 \times 10^4$, and $35.5 - (0.0012) \cdot I + (10^{-8}) \cdot (I)^2 \leq P \leq 10000$ <Equation 14>

$5 \times 10^4 \leq I \leq 10^5$, and $0.5 \leq P \leq 10000$ <Equation 15>

The ranges of the light intensity I and the process time P satisfying Equations 12 to 15 approximately correspond to a region denoted by B in FIG. 7.

As described above, in this embodiment of the present invention, the ranges of the temperature T and the light intensity I of the main processing process (ST56) are defined to achieve hydrogen conversion. In addition, the range of the process time P is also defined to effectively achieve hydrogen conversion. Consequently, it is possible to effectively prevent lowering in characteristics of the semiconductor substrate 110 which may be caused in the semiconductor substrate 110 when light is emitted to the semiconductor substrate 110.

As described above, in this embodiment of the present invention, the post-processing operation (ST50) includes the main processing process (ST56) which is carried out at predetermined ranges of the temperature T and the light intensity I, thereby preventing undesired combination (e.g. the B—O combination), which may lower the characteristics of the solar cell 100, from being generated in the semiconductor substrate 110 and, instead, generating combination including hydrogen (e.g. the B—H combination) in the semiconductor substrate 110. Consequently, it is possible to prevent lowering in characteristics of the solar cell 100 due to undesired combination. At this time, the process time P of the main processing process (ST56) may be defined to within a predetermined range to more effectively prevent generation of undesired combination.

In addition, the hydrogen diffusion process (ST52) for diffusing hydrogen and/or the preliminary heat treatment process (ST54) for generating combination including hydrogen (e.g. the B—H combination) may be further carried out before the main processing process (ST56) to more improve the effects of the post-processing operation (ST50).

In the above description, the base region 10 of the semiconductor substrate 110 includes boron (B). Alternatively, the first conductive region 20 may include boron (B). Even in an instance in which the semiconductor substrate 110 does not include boron (B), combination including hydrogen (e.g. the B—H combination) may be generated in the semiconductor substrate 110, thereby improving the characteristics of the solar cell 100.

In addition, the manufacturing method of the solar cell 100 according to the embodiment of the present invention may be applied to manufacture of a solar cell 100 including a semiconductor substrate 110 having a crystalline structure. Such a solar cell 100 will hereinafter be described in detail with reference to FIGS. 8 and 9. Parts identical to or similar to those of the solar cell according to the previous embodiment of the present invention may be equally applied to the following embodiments of the present invention, and therefore a detailed description thereof will be omitted.

Figure 8:
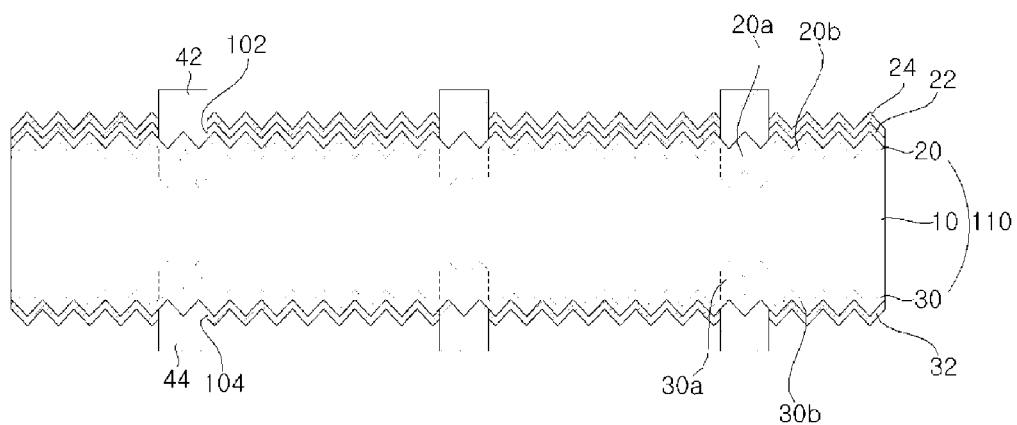
FIG. 8 is a sectional view showing another example of the solar cell manufactured using the manufacturing method of the solar cell according to the embodiment of the present invention.

FIG. 8 is a sectional view showing another example of the solar cell manufactured using the manufacturing method of the solar cell according to the embodiment of the present invention.

Referring to FIG. 8, the solar cell according to this embodiment is configured such that a second passivation film 32 is formed on a back surface of a semiconductor substrate 110, and a second electrode 44 is connected to a second conductive region 30 through the second passivation film 32 (i.e. via an opening 104).

The second passivation film 32 may be substantially formed throughout the back surface of the semiconductor substrate 110 excluding the opening 104 corresponding to the second electrode 44. The second passivation film 32 is formed at the second conductive region 30 in contact to passivate defects existing on the surface of the second conductive region 30 or in a bulk of the second conductive region 30. The passivation of defects may remove a recombination site of minority carriers, which may increase an open-circuit voltage Voc of the solar cell 100.

The second passivation film 32 may be formed of various materials. For example, the second passivation film 32 may be formed of a dielectric material including hydrogen. In an instance in which the second passivation film 32 includes hydrogen as described above, the second passivation film 32 may function to passivate the surface of the semiconductor substrate 110 and, in addition, function as a hydrogen source for supplying hydrogen to the surface of the semiconductor substrate 110 or into a bulk of the semiconductor substrate 110 at a post-processing operation (ST50) (see FIG. 3).

For example, the second passivation film 32 may include $10^{20}$ to $10^{22}$ ea/cm$^3$ of hydrogen. The hydrogen content of the second passivation film 32 is limited to a range in which the second passivation film 32 can effectively function as the hydrogen source when the second passivation film 32 passivates the surface of the semiconductor substrate 110 and at the post-processing operation (ST50). However, the embodiments of the present invention are not limited thereto. The hydrogen content of the second passivation film 32 may be variously changed.

For example, the second passivation film 32 may include a silicon nitride (SiNx:H) including hydrogen, a silicon oxide nitride (SiOxNy:H) including hydrogen, a silicon carbide (SiCx:H) including hydrogen, or a silicon oxide (SiOx:H) including hydrogen. However, the embodiments of the present invention are not limited thereto. The second passivation film 32 may include various other materials.

As described above, in this embodiment of the present invention, both the first passivation film 22 formed at the front surface of the semiconductor substrate 110 and the second passivation film 32 formed at the back surface of the semiconductor substrate 110 function as a hydrogen source at the post-processing operation (ST50), thereby doubling the effects of the post-processing operation (ST50).

However, the embodiments of the present invention are not limited thereto. The second passivation film 32 may include various materials. Alternatively, only the second passivation film 32 may include hydrogen, and the first passivation film 22 may not include hydrogen. In addition, various films may be formed on the back surface of the semiconductor substrate 110 in addition to the second passivation film 32. Various other modifications are also possible.

The second electrode 44 is electrically connected to the second conductive region 30 via the opening 104 formed through the second passivation film 32. The second electrode 44 may be formed of various materials such that the second electrode 44 can have various shapes.

For example, the second electrode 44 may have a planar shape identical to or similar to that of the first electrode 42 previously described with reference to FIGS. 1 and 2. Consequently, the semiconductor substrate 110 has a bi-facial structure in which light is incident upon both the front surface and the back surface of the semiconductor substrate 110. As a result, the quantity of light used for photoelectric conversion is increased, thereby improving the efficiency of the solar cell 100. The width and pitch of finger electrodes and bus bar electrodes of the second electrode 44 may be equal to or different from those of the finger electrodes 42a and bus bar electrodes 42b of the first electrode 42.

In another example, the second electrode 44 may be formed throughout the second passivation film 32 and may be connected to the back surface of the semiconductor substrate 110 or the second conductive region 30 in point contact via the opening 104. In this instance, the back surface of the semiconductor substrate 10 is not textured. That is, no rugged shape is formed at the back surface of the semiconductor substrate 10. Consequently, light may be effectively reflected by the second electrode 44 formed throughout the second passivation film 32. Various other modifications are also possible.

In this embodiment of the present invention, not only the first conductive region 20 has a selective structure but also the second conductive region 30 has a selective structure.

That is, the first conductive region 20 may include a first part 20a formed adjacent to (e.g. in contact with) the first electrode 42 and a second part 20b formed at a region where the first electrode 42 is not positioned. The first part 20a has a relatively high dopant concentration and a relatively large junction depth. Consequently, the first part 20a exhibits relatively low resistance. On the other hand, the second part 20b has a lower dopant concentration and a smaller junction depth than the first part 20a. Consequently, the second part 20b exhibits higher resistance than the first part 20a.

As described above, in this embodiment of the present invention, the first part 20a having relatively low resistance may be formed at a part adjacent to the first electrode 42 to reduce contact resistance with the first electrode 42. In addition, the second part 20b having relatively high resistance may be formed at a part corresponding to a light receiving region, upon which light is incident, between the first electrodes 42 to constitute a shallow emitter. Consequently, it is possible to improve current density of the solar cell 100. That is, in this embodiment of the present invention, the first conductive region 20 may have a selective structure, thereby maximizing the efficiency of the solar cell 100.

In addition, the second conductive region 30 may include a first part 30a formed adjacent to (e.g. in contact with) the second electrode 44 and a second part 30b formed at a region where the second electrode 44 is not positioned. The first part 30a has a relatively high dopant concentration and a relatively large junction depth. Consequently, the first part 30a exhibits relatively low resistance. On the other hand, the second part 30b has a lower dopant concentration and a smaller junction depth than the first part 30a. Consequently, the second part 30b exhibits higher resistance than the first part 30a.

As described above, in this embodiment of the present invention, the second part 30a having relatively low resistance may be formed at a part adjacent to the second electrode 44 to reduce contact resistance with the second electrode 44. In addition, the second part 30b having relatively high resistance may be formed at a part corresponding to a region, upon which light is incident, between the second electrodes 44 to prevent recombination between holes and electrons. Consequently, it is possible to improve current density of the solar cell 100. That is, in this embodiment of the present invention, the second conductive region 30 may have a selective structure, thereby maximizing the efficiency of the solar cell 100.

However, the embodiments of the present invention are not limited thereto. The first conductive region 20 and/or the second conductive region 30 may have a homogeneous structure as shown in FIG. 1. Alternatively, the second conductive region 30 may have a local structure which does not include the second part 30b but includes only the second part 30a.

Figure 9:
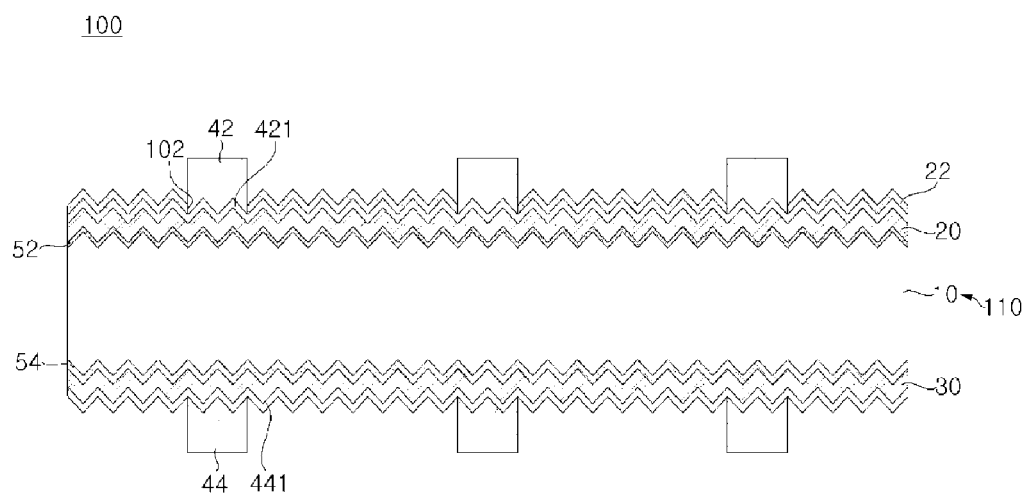
FIG. 9 is a sectional view showing a further example of the solar cell manufactured using the manufacturing method of the solar cell according to the embodiment of the present invention.

FIG. 9 is a sectional view showing a further example of the solar cell manufactured using the manufacturing method of the solar cell according to the embodiment of the present invention.

Referring to FIG. 9, the solar cell according to this embodiment is configured such that conductive regions 20 and 30 are formed on a semiconductor substrate 110 separately from the semiconductor substrate 110 and have a crystalline structure different from that of the semiconductor substrate 110. Consequently, the semiconductor substrate 110 may not include the conductive regions 20 and 30 but include only a base region 10.

More specifically, a first tunneling layer 52 may be formed on the front surface of the semiconductor substrate 110, and the first conductive region 20 may be positioned on the first tunneling layer 52.

The first tunneling layer 52 may improve the passivation characteristics of the front surface of the semiconductor substrate 110, and generated carriers may be smoothly transmitted due to a tunneling effect. The first tunneling layer 52 may include various materials, such as a nitride, a semiconductor, and a conductive polymer, which are capable of tunneling the carriers. For example, the first tunneling layer 52 may include a silicon oxide, a silicon nitride, a silicon oxide nitride, an intrinsic amorphous semiconductor (e.g. intrinsic amorphous silicon), and an intrinsic polycrystalline semiconductor (e.g. intrinsic polycrystalline silicon). In an instance in which the first tunneling layer 52 includes an intrinsic amorphous semiconductor, the semiconductor substrate 110 may be easily manufactured using a simple manufacturing process since the first tunneling layer 52 exhibits characteristics similar to those of the semiconductor substrate 110, thereby more effectively improving the surface characteristics of the semiconductor substrate 110. Consequently, it is possible to prevent surface recombination which may be generated at the surface of the semiconductor substrate 110, thereby improving the passivation characteristics of the semiconductor substrate 110.

The first tunneling layer 52 may be formed throughout the front surface of the semiconductor substrate 110. Consequently, the entirety of the front surface of the semiconductor substrate 110 may be passivated, and the first tunneling layer 52 may be easily formed without additional patterning.

In order to sufficiently achieve the tunneling effect, the first tunneling layer 52 may have a thickness of about 5 nm or less. Specifically, the first tunneling layer 52 may have a thickness of 0.5 to 5 nm (e.g. 1 to 4 nm). If the thickness of the first tunneling layer 52 is greater than 5 nm, tunneling may not be satisfactorily achieved with the result that the solar cell 100 may not be operated. On the other hand, if the thickness of the first tunneling layer 52 is less than 0.5 nm, it may be difficult to form the first tunneling layer 52 such that the first tunneling layer 52 has desired quality. In order to further improve the tunneling effect, the first tunneling layer 52 may have a thickness of 1 to 4 nm. However, the embodiments of the present invention are not limited thereto. The thickness of the first tunneling layer 52 may be variously changed.

The first conductive region 20 of a first conductive type, which is opposite to that of the semiconductor substrate 110 or the base region 10, may be formed on the first tunneling layer 52. The first conductive region 20 may form a pn junction (e.g. a pn tunnel junction) together with the semiconductor substrate 110 or the base region 10 to constitute an emitter region for generating carriers through photoelectric conversion.

The first conductive region 20, which is formed on the first tunneling layer 52 separately from the semiconductor substrate 110, may have a crystalline structure different from that of the semiconductor substrate 110. That is, the first conductive region 20 may include an amorphous semiconductor (e.g. amorphous silicon), a micro-crystalline semiconductor (e.g. micro-crystalline silicon), or a polycrystalline semiconductor (e.g. polycrystalline silicon), which may be easily formed on the first conductive region 20 using various methods, such as deposition. Consequently, the first conductive region 20 may be formed of an amorphous semiconductor (e.g. amorphous silicon), a micro-crystalline semiconductor (e.g. micro-crystalline silicon), or a polycrystalline semiconductor (e.g. polycrystalline silicon) having a first conductive dopant. The first conductive dopant may be included in a semiconductor layer when the semiconductor layer is formed for forming the first conductive region 20 or may be included in the semiconductor layer using various doping methods, such as thermal diffusion, ion injection, and laser doping, after the semiconductor layer is formed.

Similarly, a second tunneling layer 54 may be formed on the back surface of the semiconductor substrate 110, and the second conductive region 30 may be positioned on the second tunneling layer 54. The material and thickness of the second tunneling layer 54 are similar to those of the first tunneling layer 52, and therefore a detailed description thereof will be omitted. The material and crystalline structure of the second conductive region are identical to or similar to those of the first conductive region 20 except that the second conductive region 30 has a first conductive dopant, and therefore a detailed description thereof will be omitted.

In this embodiment of the present invention, a first transparent conduction layer 421 may be formed between a first electrode 42 and the first conductive region 20, and a second transparent conduction layer 441 may be formed between a second electrode 44 and the second conductive region 30.

In an instance in which the tunneling layers 52 and 54 are formed on the front surface of the semiconductor substrate 110, and then the conductive regions 20 and 30 are formed on the tunneling layers 52 and 54 as described above, it is possible to greatly improve the passivation characteristics of the semiconductor substrate 110. In addition, it is possible to reduce the thickness of the semiconductor substrate 110, which is expensive, thereby reducing manufacturing cost. Furthermore, it is possible to manufacture the solar cell 100 at a low process temperature. Since the crystallinity of the conductive regions 20 and 30 is relatively low, however, carrier mobility may be relatively low. In this embodiment of the present invention, therefore, the first transparent conduction layer 421 is formed between the first electrode and the first conductive region 20, and the second transparent conduction layer 441 is formed between the second electrode 44 and the second conductive region 30, thereby reducing resistance when the carriers move in a horizontal direction.

The first transparent conduction layer 421 may be formed throughout the first conductive region 20, which may mean that not only the first transparent conduction layer 421 may cover the entirety of the first conductive region 20 without an empty space or an empty region but also the first transparent conduction layer 421 may not be formed at a portion of the first conductive region 20. In an instance in which the first transparent conduction layer 421 is formed throughout the first conductive region 20, the carriers may easily reach the first electrode 42 via the first transparent conduction layer 421, thereby reducing resistance in the horizontal direction.

Since the first transparent conduction layer 421 is formed throughout the first conductive region 20, the first transparent conduction layer 421 may be formed of a light transmissive material. That is, the first transparent conduction layer 421 may be formed of a transparent conductive material for easily moving the carriers while transmitting light. Consequently, transmission of light is not blocked even in an instance in which the first transparent conduction layer 421 is formed throughout the first conductive region 20. For example, the first transparent conduction layer 421 may include indium tin oxide (ITO) or a carbon nano tube (CNT). However, the embodiments of the present invention are not limited thereto. The first transparent conduction layer 421 may include various other materials.

The material and shape of the second transparent conduction layer 441 may be similar to those of the first transparent conduction layer 421, and therefore a detailed description thereof will be omitted.

On the first transparent conduction layer 421 may be positioned an anti-reflection film 24 having an opening 102, via which the first electrode 42 is connected to the first transparent conduction layer 421. The anti-reflection film 24 may include a dielectric material having a lower refractive index than the first transparent conduction layer 421. In an instance in which the anti-reflection film 24 having a lower refractive index than the first transparent conduction layer 421 is formed on the first transparent conduction layer 421 as described above, the first transparent conduction layer 421 and the anti-reflection film 24 may function as a double anti-reflection film. In addition, in an instance in which the anti-reflection film 24 includes a dielectric material, the anti-reflection film 24 may be used as a mask layer when the first electrode 42 is formed so as to have a pattern. In addition, the anti-reflection film 24 may also function as a protective layer for protecting the first transparent conduction layer 421.

In this embodiment of the present invention, the anti-reflection film 24 includes hydrogen. In this instance, the anti-reflection film 24 may function as a hydrogen source at the post-processing operation (ST50). The material of the anti-reflection film 24 may be identical to or similar to that of the first passivation film 22 or the anti-reflection film 24 previously described with reference to FIG. 1, and the hydrogen content of the anti-reflection film 24 may be equal to or similar to that of the first passivation film 22 previously described with reference to FIG. 1.

In the above description and the figures, the anti-reflection film 24 positioned on the front surface of the semiconductor substrate 110 is illustrated as including hydrogen. However, the embodiments of the present invention are not limited thereto. For example, a dielectric film (e.g. the second passivation film 32 shown in FIG. 1 or an additional anti-reflection film) may be further positioned on the back surface of the semiconductor substrate 110, and the dielectric film positioned on the back surface of the semiconductor substrate 110 may include hydrogen.

The semiconductor substrate 110 including the base region 10 may be of a p-type having boron. In this instance, it is possible to greatly improve the characteristics of the solar cell 100 due to the effects obtained by the post-processing operation (ST50). However, the embodiments of the present invention are not limited thereto. For example, the semiconductor substrate 110 may have a different dopant, or may be of an n-type. Even in this instance, it is possible to achieve the effects obtained by the post-processing operation (ST50).

Hereinafter, the embodiments of the present invention will be described in more detail with reference to an experimental example. The experimental example is provided merely to describe the embodiments of the present invention in more detail and thus does not restrict the embodiments of the present invention.

Experimental Example

A solar cell having a structure as shown in FIG. 1 was manufactured using a semiconductor substrate including a p-type base region having boron. At this time, a passivation film included about $10^{20}$ ea/cm$^3$ of hydrogen, and a peak temperature was 700° C. and process time was 10 sec at an electrode firing operation. At the electrode firing operation, a hydrogen diffusion process was simultaneously carried out.

Subsequently, a preliminary heat treatment process was carried out at a temperature of about 200° C. for about 5 minutes. A main processing process was carried out for a plurality of solar cells while changing the temperature, the light intensity, and the time, within a temperature range of 200 to 700° C. and a light intensity range of $10^4$ mW/cm$^2$ to $8 \times 10^4$ mW/cm$^2$ to measure an output loss of each solar cell. Based on the measured output loss values of the solar cells, temperature and light intensity exhibiting the same output losses were mapped as shown in FIG. 10, and light intensity and time exhibiting the same output losses were mapped as shown in FIG. 11.

Figure 10:
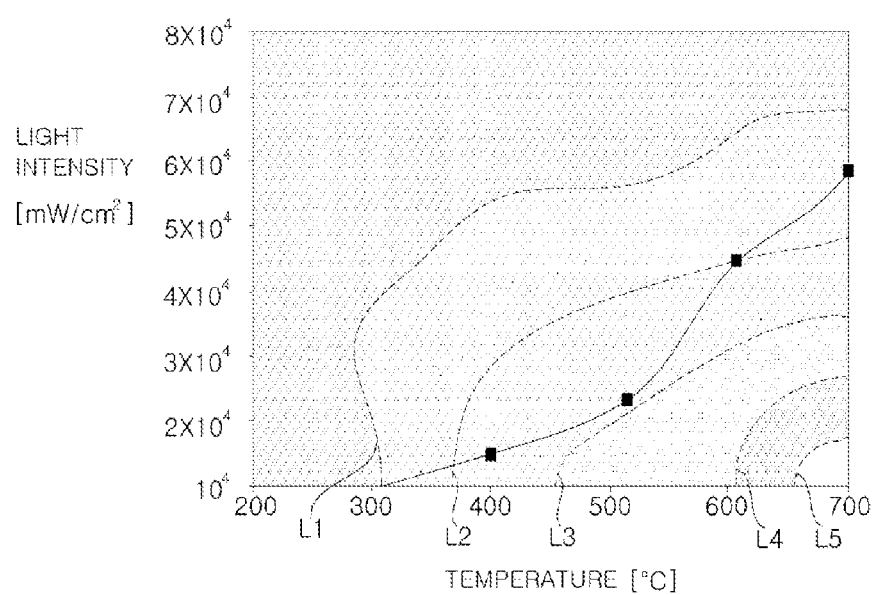
FIG. 10 is a graph showing temperature and light intensity lines exhibiting the same output losses in an experimental example of the present invention.

In FIG. 10, dotted lines L1, L2, L3, L4, and L5 interconnecting points indicating the same output losses are shown. The output loss is reduced in order of L5, L4, L3, L2, and L1. In addition, the minimum values $I_{min}$ of the light intensity calculated according to Equation 1 at temperatures of 300° C., 400° C., 500° C., 600° C., and 700° C. are shown as quadrangular points, and a line interconnecting the quadrangular points is shown as a solid line. In FIG. 11, dotted lines L11, L12, L13 interconnecting points indicating the same output losses are shown. The output loss is reduced in order of L13, L12, and L11.

Referring to FIG. 10, it can be seen that it is possible to reduce the output loss of the solar cell only when light having a predetermined light intensity or more is supplied at a uniform temperature and that it is necessary to also increase the light intensity as the temperature increases in order to reduce the output loss of the solar cell. It can also be seen that in an instance in which the light intensity is greater than that shown as the quadrangular point at each temperature, the output loss is reduced. Consequently, it can be seen that in an instance in which the main processing process is carried out at the temperature and the light intensity according to equations defined by the embodiments of the present invention, it is possible to actually reduce the output loss of the solar cell.

Figure 11:
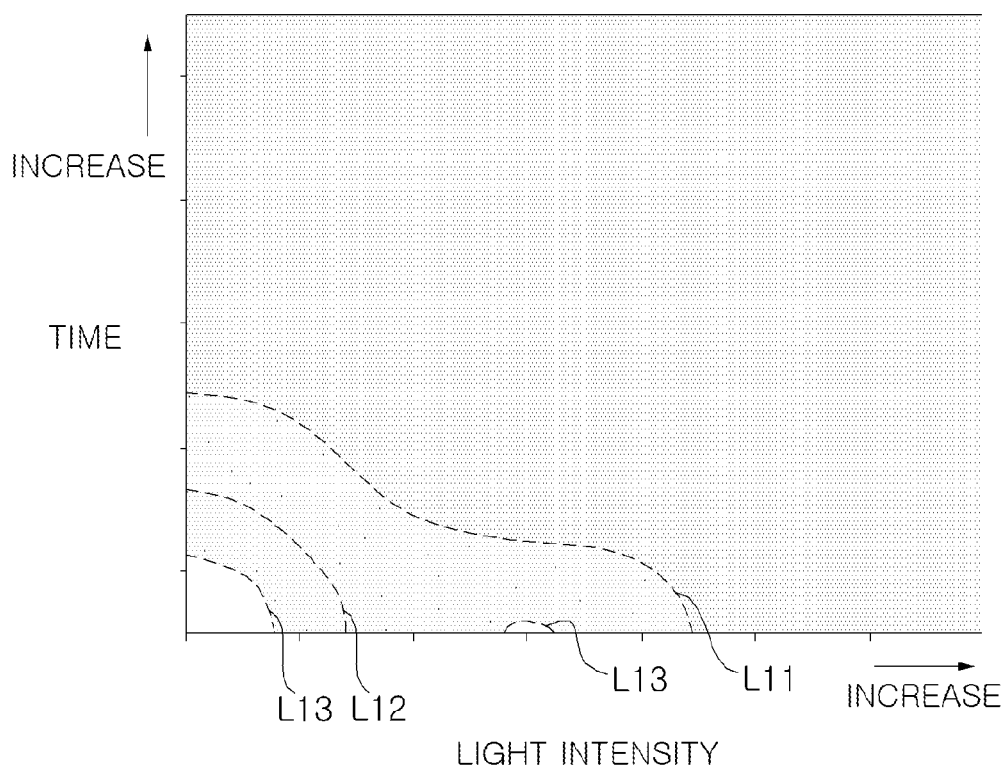
FIG. 11 is a graph showing light intensity and process time lines exhibiting the same output losses in an experimental example of the present invention.

Referring to FIG. 11, it can be seen that in an instance in which the light intensity is high, it is possible to greatly reduce the output loss even when the main processing process is carried out during a short process time. This coincides with the time-light intensity equations defined in the embodiments of the present invention.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as included in the scope and spirit of the invention as disclosed in the accompanying claims.

What is claimed is:

1. A method of manufacturing a solar cell, the method comprising:
   forming a first conductive region on a front surface of a semiconductor substrate;
   forming a second conductive region on a back surface of the semiconductor substrate, and an electrode connected to the first conductive region to form the solar cell, after forming of the first conductive region; and
   post-processing the semiconductor substrate to passivate the semiconductor substrate,
   wherein the post-processing of the semiconductor substrate comprises a main processing process for heat-treating the front and back surfaces of the semiconductor substrate while providing light to the semiconductor substrate,
   wherein the main processing process is performed after the forming of the electrode, and
   wherein a temperature of the main processing process is about 100° C. to about 800° C.

2. The method according to claim 1, wherein the semiconductor substrate has a thickness of about of 200 μm or less.

3. The method according to claim 1, further comprising:
   performing a preliminary heat treatment process for preliminarily heat-treating the semiconductor substrate, before the main processing process.

4. The method according to claim 3, wherein the preliminary heat treatment process is performed without providing light to the semiconductor substrate.

5. The method according to claim 3, wherein a temperature of the preliminary heat treatment process is about 100° C. to about 300° C.

6. The method according to claim 3, wherein a process time of the preliminary heat treatment process is about 1 minute to 30 minutes.

7. The method according to claim 1, further comprising:
performing a hydrogen diffusion process for diffusing hydrogen into an inside of the semiconductor substrate, before the main processing process,
wherein a peak temperature of the hydrogen diffusion process is about 700 to 800° C.

8. The method according to claim 7, wherein a process time of the hydrogen diffusion process is about 5 seconds to about 20 minutes.

9. The method according to claim 7, wherein the forming of the electrode comprises:
forming an electrode layer; and
firing the electrode layer,
wherein the hydrogen diffusion process is simultaneously performed with the firing of the electrode layer, or is performed between the firing of the electrode layer and the main processing process.

10. The method according to claim 1, wherein the post-processing of the semiconductor substrate comprises:
performing a hydrogen diffusion process for diffusing hydrogen into an inside of the semiconductor substrate, before the main processing process; and
performing a preliminary heat treatment process performed between the hydrogen diffusion process and the main processing process,
wherein a temperature of the preliminary heat treatment process is lower than a temperature of the hydrogen diffusion process.

11. The method according to claim 1, wherein the semiconductor substrate comprises a base region of a p-type.

12. The method according to claim 1, wherein the semiconductor substrate comprises boron as a dopant.

13. The method according to claim 1, further comprising:
forming a dielectric film including hydrogen on the first conductive region, between the forming of the first conductive region and the forming of the electrode,
wherein, in the post-processing of the semiconductor substrate, the hydrogen included in the dielectric film is diffused into an inside of the semiconductor substrate and a bond including the hydrogen and a semiconductor material of the semiconductor substrate is formed at the inside the semiconductor substrate.

14. The method according to claim 13, wherein the dielectric film includes the hydrogen in an amount of about $10^{20}$ to $10^{22}$ ea/cm$^3$.

15. The method according to claim 13, wherein the dielectric film is disposed on the front surface of the semiconductor substrate.

16. The method according to claim 1, wherein the first conductive region is a doped region formed by doping a dopant to the semiconductor substrate and constitutes a part of the semiconductor substrate, or is disposed on the semiconductor substrate to be separated from the semiconductor substrate.

17. The method according to claim 1, wherein the temperature and light intensity of the main processing process satisfy Equation 1, $$1750-31.8 \cdot T+(0.16) \cdot T^2 \leq I \qquad \text{<Equation 1>}$$

where T is the temperate (° C.) of the main processing process, and I is the light intensity (mW/cm$^2$) of the main processing process.

18. The method according to claim 17, wherein the temperature and the light intensity of the main processing process further satisfy Equation 2, $$1750-31.8 \cdot T+(0.16) \cdot T^2 \leq I \leq 10^5. \qquad \text{<Equation 2>}$$

19. The method according to claim 17, wherein the temperature and the light intensity of the main processing process satisfy one of Equations 3 to 6, $$1.7\times10^2 \leq I < 10^3, \text{ and } 13000-(31.7)\cdot I+(0.02)\cdot (I)^2 \leq P, \qquad \text{<Equation 3>}$$

$$10^3 \leq I < 10^4, \text{ and } 1030-(0.25)\cdot I+(1.5\times10^{-5})\cdot (I)^2 \leq P, \qquad \text{<Equation 4>}$$

$$10^4 \leq I \leq 5\times10^4, \text{ and } 35.5-(0.0012)\cdot I+(10^{-8})\cdot (I)^2 \leq P, \text{ and } \text{<Equation 5>}$$

$$5\times10^4 \leq I \leq 10^5, \text{ and } 0.5 \leq P, \qquad \text{<Equation 6>}$$

where I is the light intensity (mW/cm$^2$) of the main processing process, and P is process time (sec) of the main processing process.

20. The method according to claim 19, wherein the temperature and the light intensity of the main processing process satisfy one of Equations 7 to 10, $$1.7\times10^2 \leq I < 10^3, \text{ and } 13000-(31.7)\cdot I+(0.02)\cdot (I)^2 \leq P \leq 10000, \qquad \text{<Equation 7>}$$

$$10^3 \leq I < 10^4, \text{ and } 1030-(0.25)\cdot I+(1.5\times10^{-5})\cdot (I)^2 \leq P \leq 10000, \qquad \text{<Equation 8>}$$

$$10^4 \leq I \leq 5\times10^4, \text{ and } 35.5-(0.0012)\cdot I+(10^{-8})\cdot (I)^2 \leq P \leq 10000, \text{ and } \text{<Equation 9>}$$

$$5\times10^4 \leq I \leq 10', \text{ and } 0.5 \leq P \leq 10000. \qquad \text{<Equation 10>}$$

* * * * *